United States Patent
Shimomura

(10) Patent No.: US 7,700,463 B2
(45) Date of Patent: Apr. 20, 2010

(54) METHOD FOR MANUFACTURING SEMICONDUCTOR DEVICE

(75) Inventor: Akihisa Shimomura, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 433 days.

(21) Appl. No.: 11/506,855

(22) Filed: Aug. 21, 2006

(65) Prior Publication Data

US 2007/0054443 A1    Mar. 8, 2007

(30) Foreign Application Priority Data

Sep. 2, 2005    (JP)    ............................ 2005-255637

(51) Int. Cl.
*H01L 21/20* (2006.01)

(52) U.S. Cl. .................. 438/487; 438/558; 438/562; 438/795; 257/E21.134; 257/E21.148; 257/E21.413; 257/E29.277

(58) Field of Classification Search ................. 438/487, 438/535, 662, 558, 562, 795; 257/E21.134, 257/148, 413, E29.277
See application file for complete search history.

(56) References Cited

U.S. PATENT DOCUMENTS

| | | | | |
|---|---|---|---|---|
| 5,396,506 A | * | 3/1995 | Ball | ............................ 372/6 |
| 5,841,797 A | * | 11/1998 | Ventrudo et al. | ................ 372/6 |
| 6,248,604 B1 | * | 6/2001 | Eng et al. | ...................... 438/21 |
| 6,275,632 B1 | * | 8/2001 | Waarts et al. | .................. 385/37 |
| 6,385,215 B1 | * | 5/2002 | Sumiyoshi | ...................... 372/6 |
| 6,614,822 B2 | * | 9/2003 | Yoshida et al. | ............ 372/45.01 |
| 6,844,523 B2 | * | 1/2005 | Yamazaki et al. | ...... 219/121.66 |
| 6,897,166 B2 | * | 5/2005 | Sotani et al. | ................. 438/795 |
| 7,112,760 B2 | * | 9/2006 | Ishikawa et al. | ........ 219/121.76 |
| 7,365,285 B2 | * | 4/2008 | Toida | ..................... 219/121.65 |
| 7,435,668 B2 | * | 10/2008 | Machida et al. | .............. 438/487 |
| 2003/0141505 A1 | | 7/2003 | Isobe et al. | |
| 2003/0141521 A1 | | 7/2003 | Isobe et al. | |
| 2003/0218171 A1 | | 11/2003 | Isobe et al. | |
| 2005/0170572 A1 | * | 8/2005 | Hongo et al. | ................ 438/166 |
| 2006/0237404 A1 | | 10/2006 | Ishikawa et al. | |

FOREIGN PATENT DOCUMENTS

| | | |
|---|---|---|
| CN | 1467802 | 1/2004 |
| JP | 2003-297751 | 10/2003 |
| JP | 2004-111584 | 4/2004 |
| JP | 2005-157127 | 6/2005 |

OTHER PUBLICATIONS

Office Action (Application No. 200610126730.1;CN9007) Dated May 8, 2009, with English translation.

* cited by examiner

*Primary Examiner*—Michael S Lebentritt
(74) *Attorney, Agent, or Firm*—Nixon Peabody LLP; Jeffrey L. Costellia

(57) ABSTRACT

A semiconductor device having high electrical characteristics is manufactured at low cost and with high throughput. A semiconductor film is crystallized or activated by being irradiated with a laser beam emitted from one fiber laser. Alternatively, laser beams are emitted from a plurality of fiber lasers and coupled by a coupler to be one laser beam, and then a semiconductor film is irradiated with the coupled laser beam so as to be crystallized or activated.

35 Claims, 18 Drawing Sheets

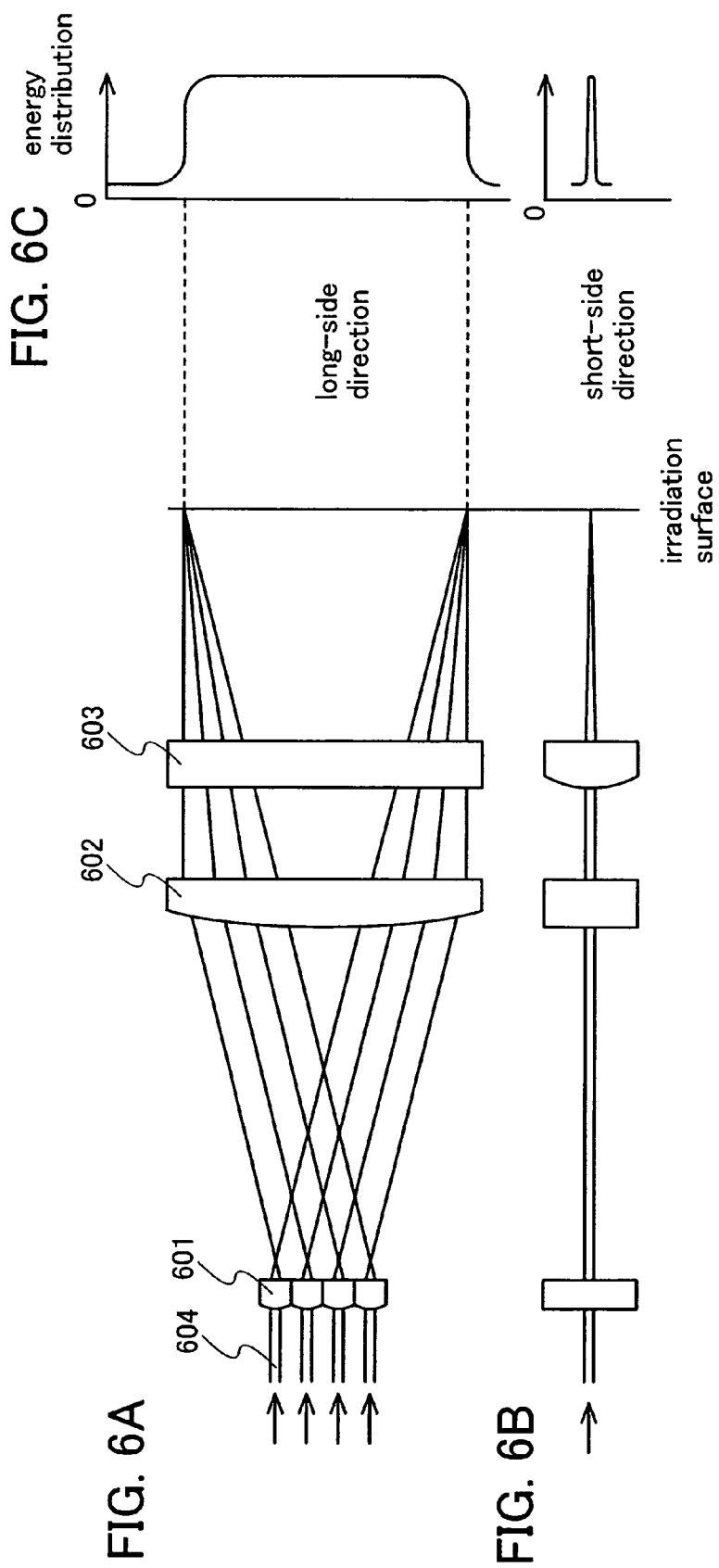

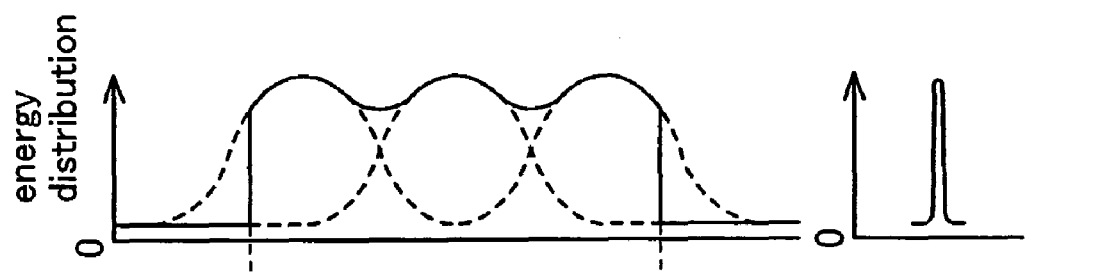
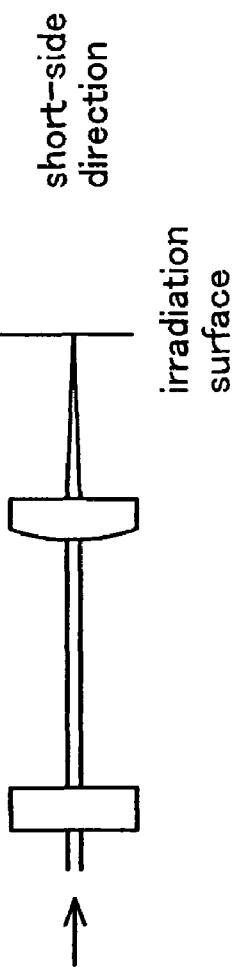
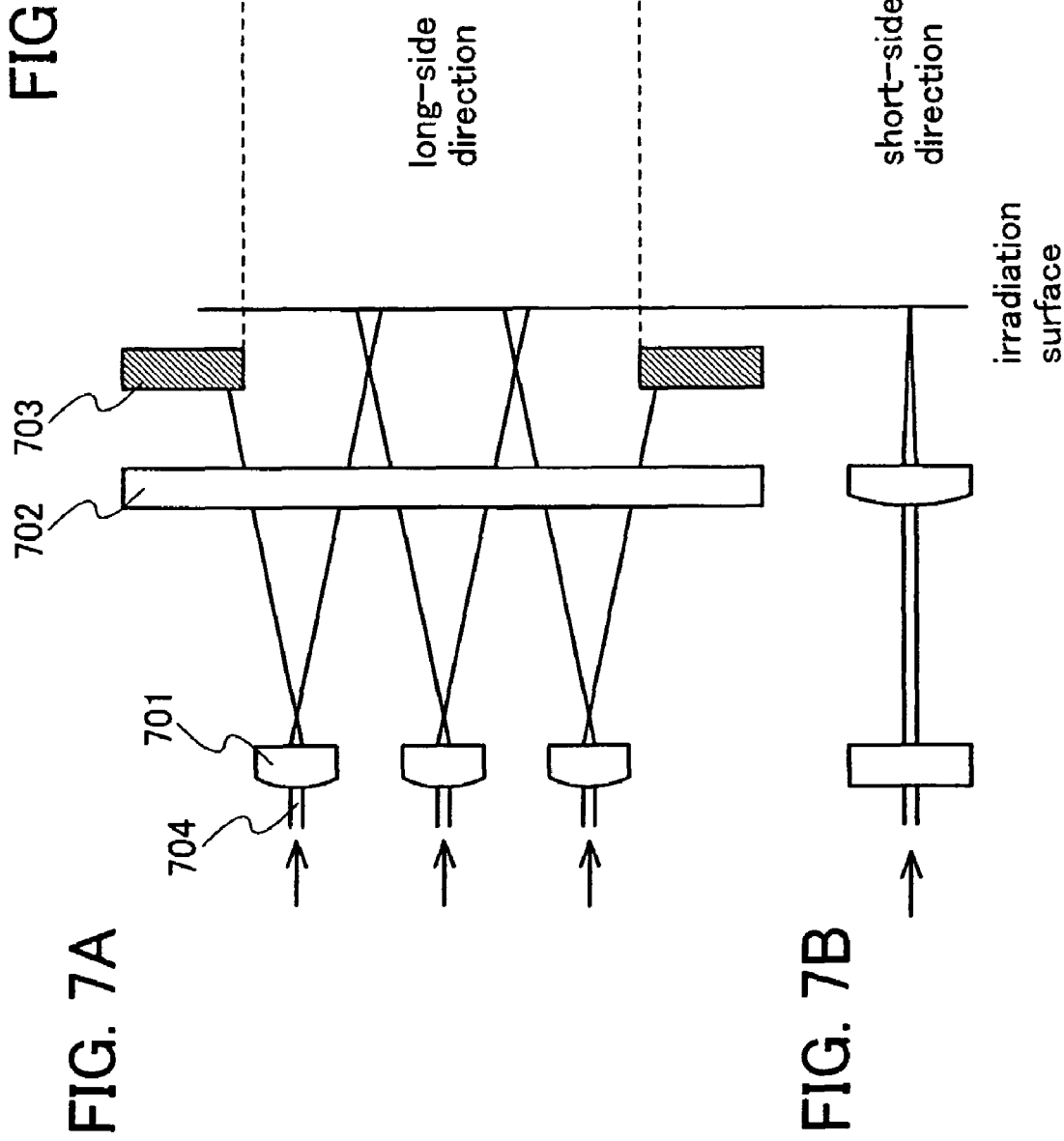

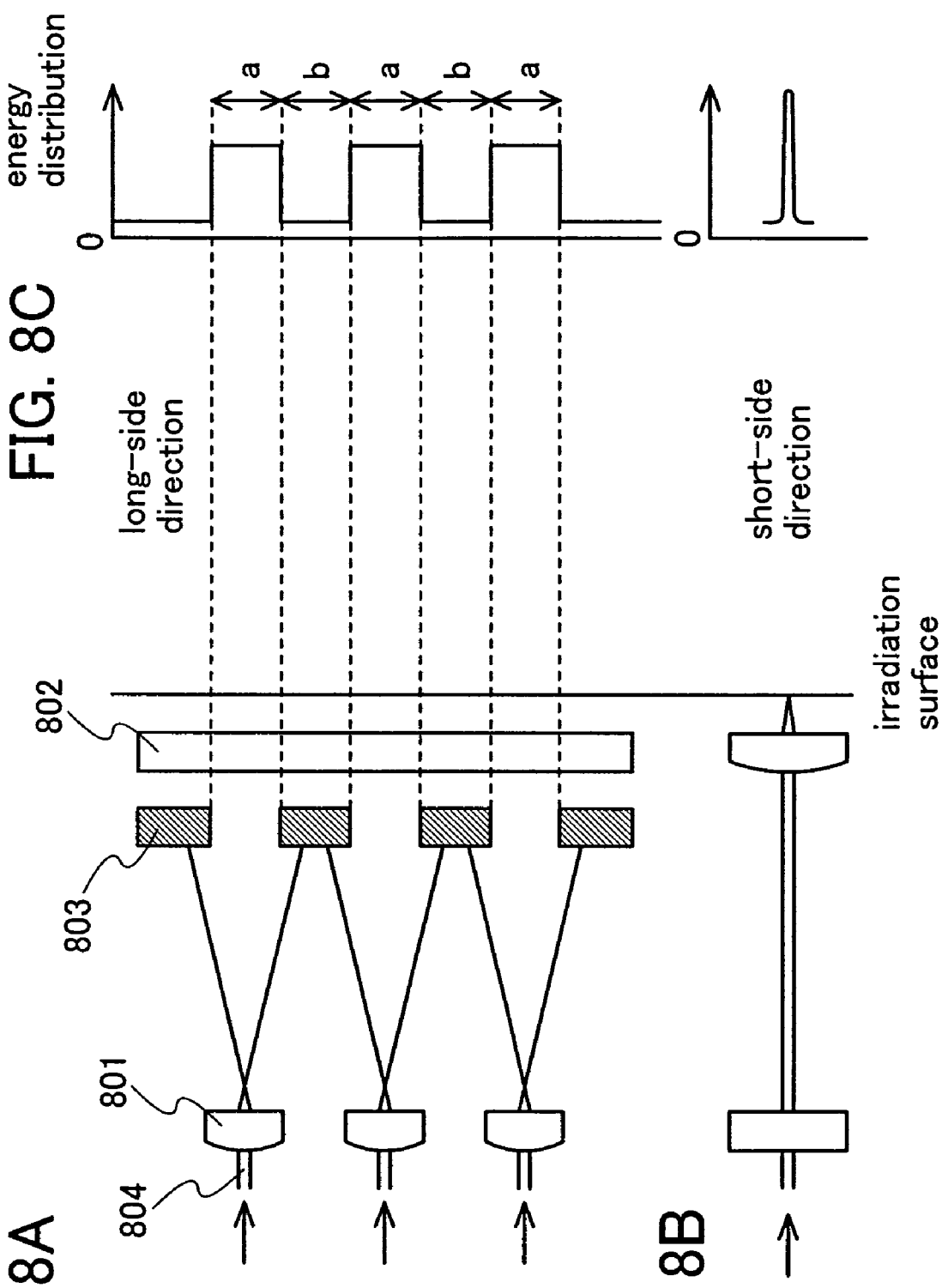

METHOD FOR MANUFACTURING SEMICONDUCTOR DEVICE

BACKGROUND OF THE INVENTION

1. Field of Invention

The present invention relates to a method for manufacturing a semiconductor device. The present invention particularly relates to a method for manufacturing a semiconductor device, in which a semiconductor film is heated by laser irradiation.

2. Description of the Related Art

In recent years, attention has been attracted to a technique for manufacturing thin film transistors (TFTs) by using a semiconductor thin film (with a thickness of about several nanometers to several hundred nanometers) formed over a substrate having an insulating surface. Thin film transistors are widely applied to electronic devices such as ICs and electro-optic devices, and development of thin film transistors as switching elements particularly for image display devices is urgently required.

With the increase in size of image display devices and image sensors and in density of pixels (higher definition), elements using semiconductor thin films capable of following higher-speed driving are required to be developed. Moreover, in order to reduce weight and cost, thin film transistors have come to be used as not only switching elements of image display devices but also driver elements provided around display regions.

In order to fulfill such requirements, researches have been carried out on a technique for improving electrical characteristics such as electric field effect mobility (also called mobility, simply) by forming a semiconductor film having a crystal structure. For example, a solid-phase growth method and a method of carrying out a heat treatment using a laser beam (also called "laser light") are studied. The method of carrying out a heat treatment using a laser beam is hereinafter referred to as a laser anneal method. In particular, the laser anneal method has advantages in that process time can be drastically shortened as compared with a solid-phase growth method and a semiconductor substrate or a semiconductor film over a substrate can be selectively heated so that the substrate is hardly damaged thermally (for example, see Reference 1: Japanese Patent Laid-Open No. 2003-297751).

Lasers used in the laser anneal method are classified into gas lasers, liquid lasers, and solid lasers according to their mediums. As a laser oscillation method, a continuous wave oscillation type and a pulsed oscillation type are given.

A technique has been attracting attention lately in which a semiconductor film is heated by a solid laser (such as a Nd:YVO$_4$ laser) instead of a method in which a semiconductor film is heated by an excimer laser, which is one kind of gas lasers (hereinafter also referred to as an excimer laser anneal (ELA) method in this specification). Although a solid laser can form a large crystal grain or a single crystal as compared with the excimer laser anneal method, a solid laser has the following drawbacks.

In the case of crystallizing a semiconductor film formed over a large substrate, a long linear beam is required in consideration of throughput. However, since a solid laser has difficulty in forming a long linear beam, mass productivity is low. This is a problem caused in the case of using a solid laser in a process for heating a semiconductor film.

In order to form a long linear beam, it is necessary to increase output power of a laser beam, and moreover, to heat a semiconductor film effectively, i.e., have a semiconductor film absorb a laser beam effectively. A wavelength of a laser beam which has high absorption efficiency to a silicon film, which is a typical semiconductor film, ranges from visible to ultraviolet regions; on the other hand, a wavelength region of a laser beam of a fundamental wave used as a solid laser mainly ranges from infrared to near-infrared regions. Therefore, in order to effectively heat a semiconductor film by using a solid laser, it is necessary to use a non-linear optical element having a function of converting a laser beam of a fundamental wave into a harmonic (such as a second harmonic or a third harmonic). However, this non-linear optical element has a threshold at which the element is damaged by input power of a fundamental wave; therefore, increasing output power of a harmonic has restriction.

Moreover, a solid laser has a complex oscillator which is sensitive to vibration, and further has problems of high power consumption, necessity of an optical system for beam shaping, necessity of maintenance and cooling water, and the like.

SUMMARY OF THE INVENTION

In view of the aforementioned problems, it is an object of the present invention to manufacture a semiconductor device superior in electrical characteristics at low cost and with high throughput.

According to the present invention, a semiconductor film is heated by using a fiber laser. A fiber laser is typically used in a manufacturing process for a semiconductor device; specifically, in a process for crystallizing a semiconductor film in a thin film transistor or in activation of an impurity-doped semiconductor film.

According to a method for manufacturing a semiconductor device of the present invention, a semiconductor film is crystallized or activated by being irradiated with a laser beam emitted from one fiber laser.

According to a method for manufacturing a semiconductor device of the present invention, laser beams emitted from a plurality of fiber lasers are coupled into one laser beam by using a coupler, and a semiconductor film is irradiated with the coupled laser beam so as to be crystallized or activated.

According to a method for manufacturing a semiconductor device of the present invention, a laser beam emitted from one fiber laser is divided into a plurality of laser beams by using a coupler, and a semiconductor film is irradiated with the divided laser beams so as to be crystallized or activated.

According to a method for manufacturing a semiconductor device of the present invention, exits of a plurality of fiber lasers are arranged at certain intervals, and a semiconductor film is irradiated with a plurality of laser beams emitted from the exits so as to be crystallized or activated.

According to a method for manufacturing a semiconductor device of the present invention, one or more laser beams emitted from one or more fiber lasers are shaped into one linear beam through an optical system, and a semiconductor film is irradiated with the linear beam so as to be crystallized or activated.

According to a method for manufacturing a semiconductor device of the present invention, one or more laser beams emitted from one or more fiber lasers are shaped into a plurality of linear beams through an optical system, and a semiconductor film is irradiated with the linear beams so as to be crystallized or activated.

According to a method for manufacturing a semiconductor device of the present invention, the semiconductor film is an amorphous semiconductor film in the above structure.

Moreover, a method for manufacturing a semiconductor device of the present invention includes: forming a base film over a glass substrate; forming an amorphous silicon film over the base film; crystallizing the amorphous silicon film by irradiating the amorphous silicon film with a laser beam emitted from one fiber laser; forming a gate insulating film over the crystallized silicon film; forming a gate electrode over the gate insulating film; forming an impurity region by adding an impurity to the crystallized silicon film using the gate electrode as a mask; and irradiating the impurity region with a laser beam emitted from one fiber laser.

According to a method for manufacturing a semiconductor device of the present invention, the fiber lasers are continuous wave lasers in the above structure.

According to a method for manufacturing a semiconductor device of the present invention, the fiber lasers each have a non-linear optical element for converting a laser beam of a fundamental wave into a second harmonic in the above structure.

In this specification, the semiconductor device indicates all the devices that operate by utilizing semiconductor characteristics. Moreover, all the devices using semiconductor films are included in the semiconductor device.

According to the present invention, a semiconductor film is heated by using a fiber laser. In comparison with an excimer laser or a conventional rod-type solid laser, a fiber laser has an oscillator with a simple structure and is resistant to vibration. Further, a fiber laser does not require an optical system for shaping a laser beam or requires only a simple optical system. Furthermore, a fiber laser consumes less electric power, and does not require maintenance and cooling water.

By using fiber lasers in combination, a beam having an arbitrary shape can be formed. According to the present invention by which a semiconductor device can be manufactured using a semiconductor film heated (crystallized) by irradiation with a fiber laser beam having such features, improvement of productivity and cost reduction for the semiconductor device can be achieved in comparison with the case of using an excimer laser or a conventional rod-type solid laser.

BRIEF DESCRIPTION OF THE DRAWINGS

In the accompanying drawings:

FIGS. 6A to 6C show a method for manufacturing a semiconductor device of the present invention (Embodiment Mode 5);

FIGS. 7A to 7C show a method for manufacturing a semiconductor device of the present invention (Embodiment Mode 6);

FIGS. 8A to 8C show a method for manufacturing a semiconductor device of the present invention (Embodiment Mode 7);

DETAILED DESCRIPTION OF THE INVENTION

Figure 1:
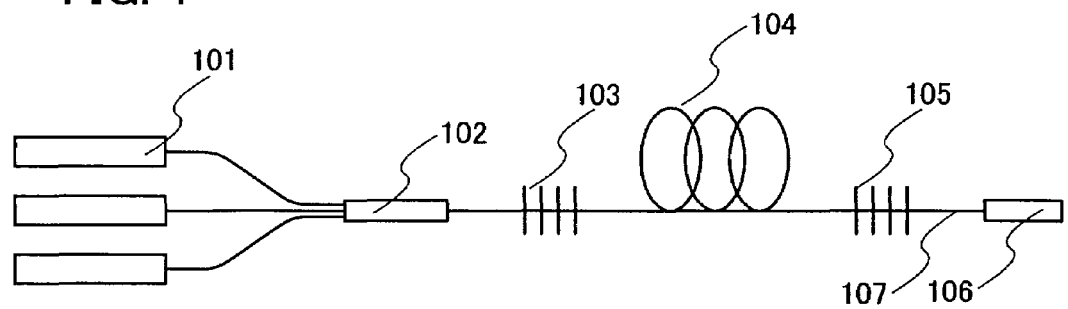
FIG. 1 shows a method for manufacturing a semiconductor device of the present invention (Embodiment Mode 1)

Embodiment modes and embodiments of the present invention will be hereinafter described with reference to the accompanying drawings. However, the present invention is not restricted to the structures described below, and it is easily understood by those skilled in the art that the mode and detail can be variously changed without departing from the scope and spirit of the present invention. Therefore, the present invention is not construed as being restricted to the description of the embodiment modes and embodiments hereinafter shown. It is to be noted in the following structure that the reference numeral indicating the same part will be used in common throughout the drawings.

It is to be noted that various materials, conditions of values, and the like shown in this specification are set for products that are aimed to be formed. Thus, it is easily understood by those skilled in the art that some errors may be observed in element compositions and physical properties of the actually-formed products. Moreover, it is also easily understood by those skilled in the art that results measured by various measurement methods normally include some errors. Therefore, the present invention is not construed as being limited to the description of the embodiment modes and embodiments hereinafter shown. Moreover, the scope of the present invention also includes some errors of the composition of the materials, the values, and the like described in this specification.

Embodiment Mode 1

This embodiment mode will describe a structure of a method for manufacturing a semiconductor film with reference to drawings. In particular, a fiber laser used in the present invention will be described in detail.

A fiber laser uses an optical waveguide (optical fiber) as an oscillator. A structure of an oscillator of a fiber laser is described with reference to FIG. 1. A fiber laser has a laser diode (LD) 101 for excitation, an excited light combiner 102, fiber bragg gratings 103 and 105, an optical fiber 104 with its core doped with a laser medium (hereafter the optical fiber 104 is called an "active gain fiber"), and an output port 106. These appliances are connected to each other through a fiber cable 107. It is to be noted that the fiber laser can oscillate either in a continuous wave manner or a pulsed manner.

The excited light combiner 102 combines excited light emitted from a plurality of the laser diodes 101, and this combined light is inputted to the fiber bragg grating 103. Although FIG. 1 shows a structure of the oscillator which includes the excited light combiner 102, it is not always necessary that the oscillator include the excited light combiner 102. In other words, one laser diode 101 and the fiber bragg grating 103 may be connected to each other directly through the fiber cable 107 so that the excited light outputted from the laser diode 101 is directly inputted to the fiber bragg grating 103.

The fiber bragg grating 103 functions as a total-reflection mirror of a laser oscillator, while the fiber bragg grating 105 functions as an output mirror. The fiber bragg gratings 103 and 105 do not need regular cleaning and alignment, differently from an oscillator mirror of a solid laser such as a YAG laser. Thus, in comparison with a solid laser, high resistance to thermal deformation and mechanical impact, a high maintenance property, and a high mobile property can be obtained. The laser beam emitted from the fiber bragg grating 105 is outputted (emitted) to the outside of the optical fiber through the output port 106. In this embodiment mode, the laser beam emitted from the fiber bragg grating 105 has a circular shape with a diameter of several tens micrometers (typically 10 to 30 μm). The beam spot of the laser beam may be not only circular but also elliptical or square.

Figure 2:
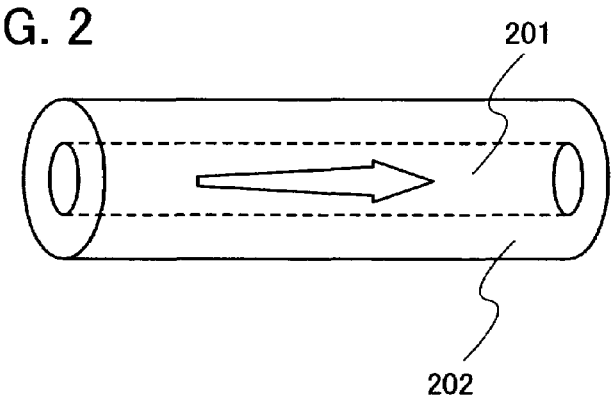
FIG. 2 shows a method for manufacturing a semiconductor device of the present invention (Embodiment Mode 1)

The active gain fiber 104 includes a cylindrical core 201 doped with a rare earth metal such as erbium (Er) or ytterbium (Yb) and a pipe-shaped clad 202 (FIG. 2). The core 201 has a diameter of several tens micrometers (typically 10 to 30 μm). Upon the input of the excited light from the fiber bragg grating 103, a laser oscillates in the active gain fiber 104. Here, the active gain fiber 104 functions like an optical converter by which a wavelength, a beam quality, and the like of light inputted from the laser diode 101 are converted. The clad 202 may have either a single-layer or two-layer structure. In the case of a two-layer structure, for example, an inner clad made of silica and an external clad made of polymer may be used. The cross-sectional shape of the clad 202 may be circular, square, or polygonal.

The fiber cable 107 has a two-layer structure which includes a cylindrical core having a high refractive index and a pipe-shaped clad having a low refractive index and covering a circumference of the core. The clad confines light having entered the optical fiber. The external diameter of the clad ranges from 100 to 150 μm. Since the core has a higher refractive index than the clad covering the core, the light having entered the optical fiber transmits to the outside through the core portion.

A pattern (mode) by which an optical signal is transmitted inside an optical fiber depends on an intended purpose, and the following three modes are mainly given: a multimode step type, a multimode graded type, and a single mode type. Any mode is applicable to the present invention; however, a single mode type is preferable.

Moreover, it is preferable to provide a non-linear optical element between the fiber bragg grating 105 and the output port 106. By providing the non-linear optical element, a laser beam of a fundamental wave emitted from the laser diode 101 can be converted into a harmonic (such as a second harmonic or a third harmonic).

Figure 3:
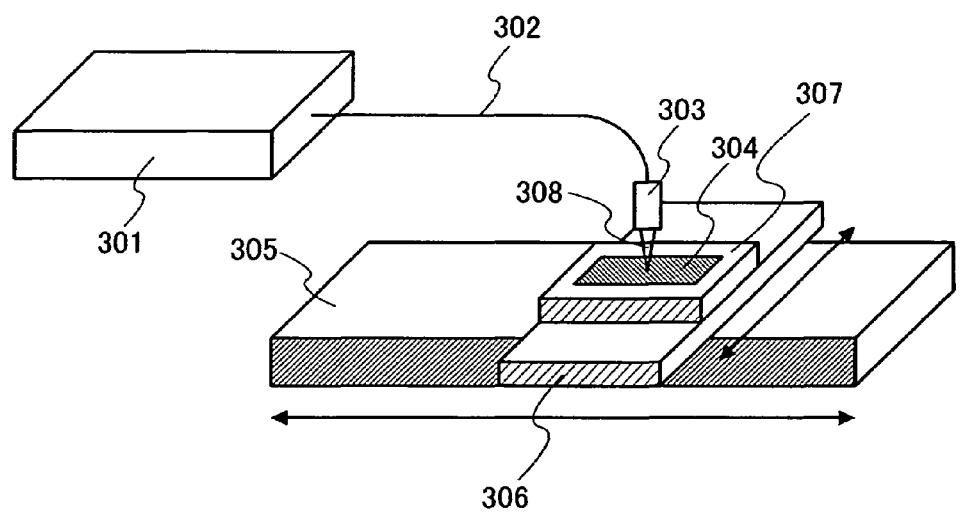
FIG. 3 shows a method for manufacturing a semiconductor device of the present invention (Embodiment Mode 1)

Next, an example of crystallizing a semiconductor film by heating the semiconductor film using a fiber laser is described with reference to FIG. 3. A substrate 304 with a semiconductor film formed is provided over a stage that includes an X-axis stage 305, a Y-axis stage 306, and a suction stage 307. Next, a top surface of the substrate provided over the stage is irradiated with a laser beam 308. The laser beam 308 travels from a fiber laser oscillator 301 to an output port 303 (exit) through a transmission fiber cable 302, and is emitted from the output port 303 to be delivered to the semiconductor film. The laser beam 308 may be delivered relative to the semiconductor film over the substrate. Therefore, it is also possible to use other stages than the biaxial stage shown in FIG. 3 (X-axis stage and Y-axis stage). For example, a uniaxial stage can also be used. In this case, it is necessary that the output port 303 (exit) can move in a direction intersecting with a moving direction of the uniaxial stage.

As the substrate, a glass substrate, a quartz substrate, a silicon substrate (wafer), a metal substrate (such as a stainless steel substrate), a ceramic substrate, a plastic substrate (such as an acrylic substrate), or the like can be used. Moreover, a heat-resistant plastic substrate that can resist a heat treatment in a manufacturing process for a semiconductor device can also be used. Among these substrates, a heat-resistant plastic substrate or a glass substrate is preferably used. A glass substrate is not much restricted in size and shape. Thus, in the case of using a glass substrate as the substrate 304, for example, a rectangular substrate with a length of 1 m or more on one side can be easily used, which can drastically increase the productivity. This is a superior point to a circular silicon substrate. Even in terms of cost of a substrate itself, a glass substrate is more preferable than a quartz substrate, a silicon substrate, a metal substrate (such as a stainless steel substrate), a ceramic substrate, and the like. In particular, when a large substrate is required, the superiority in low cost is so remarkable that a glass substrate is also preferable in consideration of mass productivity. In this embodiment mode, a glass substrate is used as the substrate.

The semiconductor film may be either amorphous or crystalline. As a material for the semiconductor film, silicon, germanium, silicon germanium, zinc oxide which is a transparent oxide, or the like can be used. In this embodiment mode, an amorphous silicon film is used.

In the present invention in which the semiconductor film is crystallized by being irradiated with the laser beam emitted from the fiber laser, improvement in productivity and cost reduction for a semiconductor device can be achieved as compared with the case of crystallization using a solid laser.

Embodiment Mode 2

This embodiment mode will describe a structure of a method for manufacturing a semiconductor film, with reference to drawings.

Figure 4:
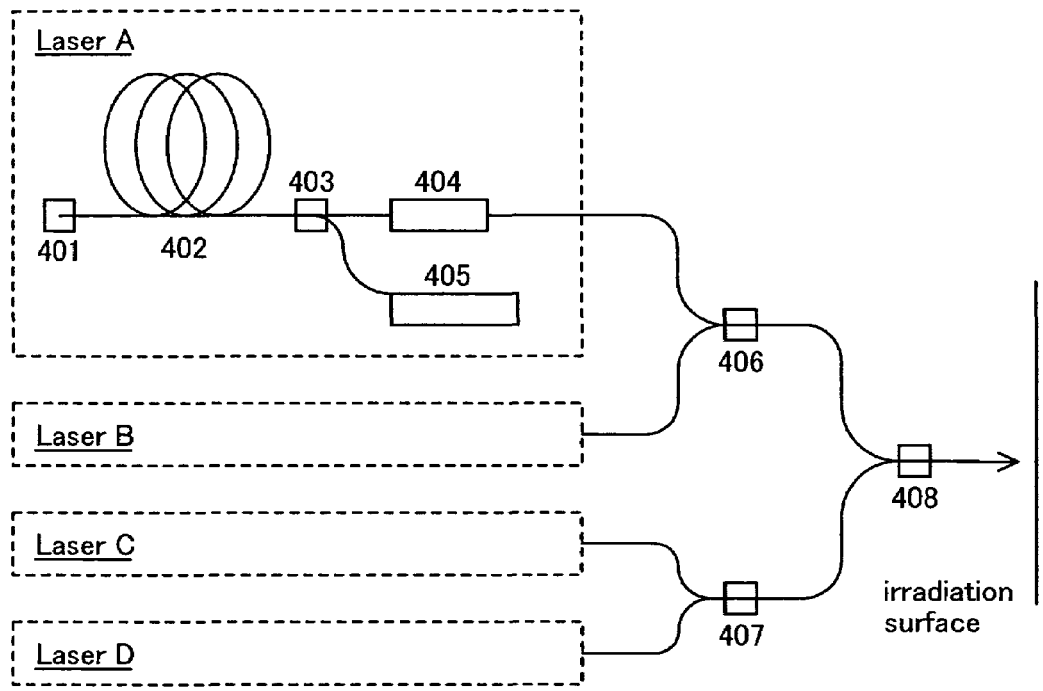
FIG. 4 shows a method for manufacturing a semiconductor device of the present invention (Embodiment Mode 2)

In this embodiment mode, laser beams emitted from a plurality of fiber laser oscillators are coupled by a coupler 406 and the coupled laser beam is applied to a manufacturing process of a semiconductor device (FIG. 4). For example, the laser irradiation is applied to a process of crystallization or activation of a semiconductor film.

In FIG. 4, a laser oscillator A includes a fiber bragg grating 401, an optical fiber 402 for amplifying light, a wavelength division multiplexer (WDM) 403, a non-linear optical element 404, and a laser diode 405. In this embodiment mode, a laser oscillator B, a laser oscillator C, and a laser oscillator D have the same structure as the laser oscillator A; however, the laser oscillators B, C, and D may have different structures from the laser oscillator A.

Laser beams emitted from the laser oscillators A and B through fiber cables respectively are coupled by the coupler 406. Similarly, laser beams emitted from the laser oscillators C and D through fiber cables respectively are coupled by a coupler 407. Moreover, the laser beam coupled by the coupler 406 and the laser beam coupled by the coupler 407 are coupled by a coupler 408. Although this embodiment mode shows an example of using four laser oscillators in FIG. 4, the number of laser oscillators used in the present invention only needs to be two or more. For example, when a laser beam emitted from the laser oscillator A having the non-linear optical element 404 for converting the laser beam into a second harmonic and a laser beam emitted from the laser oscillator B not having the non-linear optical element 404 are coupled by a coupler, a laser beam of a second harmonic and a laser beam of a fundamental wave can be coupled.

The non-linear optical element 404 included in the laser oscillator has a function of converting a laser beam of a fundamental wave into a harmonic (such as a second harmonic or a third harmonic). For example, by converting a fundamental wave with a near-infrared wavelength into a second harmonic using the non-linear optical element 404, visible light can be obtained. A wavelength of a laser beam having high absorption efficiency to a silicon film ranges from visible to ultraviolet regions. In other words, by converting a fundamental wave with a near-infrared wavelength into visible light which is a second harmonic using the non-linear optical element 404, a silicon film can absorb the laser beam efficiently.

In this embodiment mode, a plurality of fiber lasers are prepared and laser beams emitted from the plurality of fiber lasers are coupled by the coupler 406 instead of increasing the output power of the laser diode 405 itself included in one fiber laser oscillator. Such a structure makes it possible to increase the output power of the laser beam without damaging the non-linear optical element 404.

When the laser beams emitted from the plurality of laser oscillators are coupled by using the coupler as shown in this embodiment mode, insertion loss (loss of light energy) at laser beam coupling can be suppressed as compared with a method using a diffractive optical element or a beam splitter. Therefore, cost reduction in manufacturing a semiconductor device can be achieved. Moreover, multistep connection is also possible by using a plurality of couplers.

Embodiment Mode 3

This embodiment mode will describe a different structure from that described in Embodiment Mode 2.

In this embodiment mode, a laser beam emitted from one fiber laser is divided into a plurality of laser beams by a coupler and the divided laser beams are delivered to a semiconductor film (irradiation surface).

Figure 21:
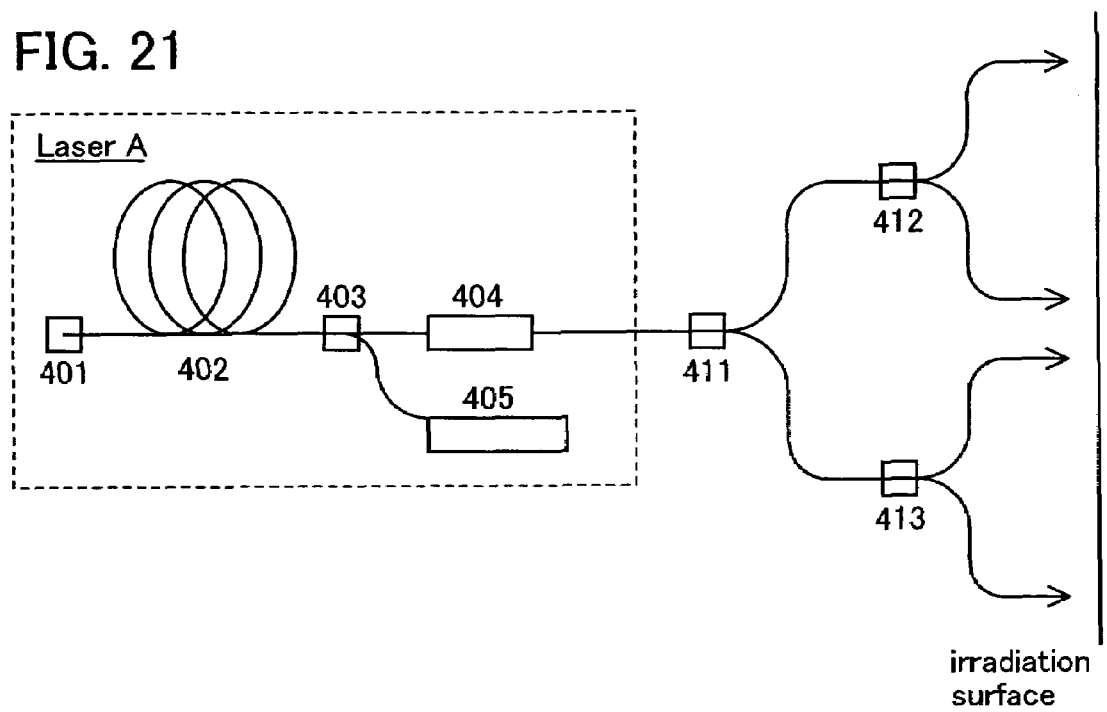
FIG. 21 shows a method for manufacturing a semiconductor device of the present invention (Embodiment Mode 3).

For example, as shown in FIG. 21, a laser beam emitted from a laser oscillator A is divided by a coupler 411 and the divided laser beams are further divided by couplers 412 and 413. By irradiating a semiconductor film with the laser beams thus divided into four, the semiconductor film can be crystallized or activated.

Embodiment Mode 4

This embodiment mode will describe a structure of a method for manufacturing a semiconductor film, with reference to drawings.

Figure 5:
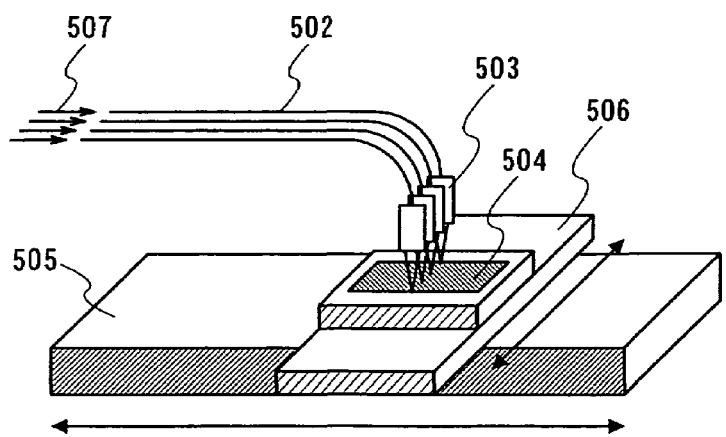
FIG. 5 shows a method for manufacturing a semiconductor device of the present invention (Embodiment Mode 4)

In this embodiment mode, a semiconductor film is irradiated by arranging exits 503 of laser beams emitted from a plurality of fiber lasers through transmission fiber cables 502 (FIG. 5). The laser beams travel in directions indicated by arrows 507 shown in FIG. 5.

The laser beams emitted from the exits 503 have circular beam spots and these beam spots may or may not overlap with each other. If the beam spots overlap with each other, overlapping ratio may be set, for example, in the range of 10 to 50%.

This embodiment mode can be combined appropriately with any of Embodiment Modes 1 to 3. For example, a plurality of laser beams may be prepared by coupling laser beams emitted from a plurality of fiber lasers, and a semiconductor film may be irradiated by arranging the exits of the laser beams.

Embodiment Mode 5

This embodiment mode will describe a structure of a method for manufacturing a semiconductor film, with reference to drawings.

In this embodiment mode, the exits 503 of laser beams emitted from four fiber lasers through the transmission fiber cables 502 are arranged, and then the laser beams emitted from these four exits 503 are shaped into linear beams through optical systems. Subsequently, the linear beams are delivered to a semiconductor film.

In this specification, the term "linear" does not mean a line in a strict sense but means a shape with a high aspect ratio (such as a rectangle, a long ellipse, or the like). For example, a shape with an aspect ratio of 2 or more (preferably 10 to 10000) is referred to as linear.

An example of an optical system for forming a linear beam is shown in FIGS. 6A and 6B. FIG. 6A is a plan view in which a long-side direction of a linear beam spot formed by an optical system is included in the paper. FIG. 6B is a side view in which a short-side direction of the linear beam spot formed by the optical system is included in the paper. The long-side direction and the short-side direction correspond to directions along which the width of the beam spot formed on the irradiation surface is long and short, respectively. The laser beams emitted from the fiber lasers travel in directions indicated by arrows shown in FIGS. 6A and 6B.

As shown in FIGS. 6A and 6B, when the laser beams emitted from the fiber lasers are shaped by a cylindrical lens array 601 and cylindrical lenses 602 and 603, a linear beam with a length of 1 mm or less on a short side and a length of 1 mm to several meters on a long side can be easily obtained. For example, when laser beams 604 emitted from four fiber laser oscillators each having an output power of 8 W are shaped like in this embodiment mode, a linear beam with a length of about 1 mm on a long side can be obtained.

Since the linear beam obtained by using this optical system has homogeneous energy distribution in the long-side direction as shown in FIG. 6C, a semiconductor film can be heated more homogeneously. As the lenses used in this embodiment mode, for example, lenses made of synthetic quartz can be used.

Although the four fiber lasers are used to form one linear beam in this embodiment mode, the present invention is not restricted to this structure. In other words, one or more fiber lasers may be used to form one linear beam. Moreover, in order to form the laser beams 604 emitted from the four fiber lasers, the structures described in Embodiment Mode 2 and 3 may be appropriately employed. That is, the laser beams coupled or divided by the coupler may be used as the laser beams 604 prior to transmitting through the cylindrical lens array 601.

By using this method, the linear beam can be formed. Moreover, by increasing the number of fiber laser oscillators, the linear beam can be extended unlimitedly-long in principle. Thus, this method makes it possible to manufacture semiconductor devices without lowering productivity even in the case where the size of a substrate with a semiconductor film formed becomes larger.

When a semiconductor film is crystallized by being heated using the thus obtained linear beam with homogenous intensity and a semiconductor device is manufactured by using this semiconductor film, the semiconductor device can have favorable and homogeneous characteristics.

This embodiment mode can be appropriately combined with any of Embodiment Modes 1 to 4.

Embodiment Mode 6

This embodiment mode will describe an optical system having a different structure from that described in Embodiment Mode 5.

In this embodiment mode, three exits 503 (output ports) of laser beams emitted from three fiber laser oscillators through the transmission fiber cables 502 are arranged, and then the laser beams emitted from these three exits 503 are shaped into linear beams by optical systems. Subsequently, the linear beams are delivered to a semiconductor film.

An example of an optical system for forming a linear beam is shown in FIGS. 7A and 7B. FIG. 7A is a plan view in which a long-side direction of a linear beam spot formed by an optical system is included in the paper. FIG. 7B is a side view in which a short-side direction of the linear beam spot formed by the optical system is included in the paper. The laser beams emitted from the fiber lasers travel in directions indicated by arrows shown in FIGS. 7A and 7B.

Laser beams 704 emitted from the three exits 503 are shaped into linear beams through three cylindrical lenses 701 and a cylindrical lens 702. Each of these linear beams has such energy distribution that energy is gradually attenuated toward opposite end portions of the linear beam in the long-side direction as can be seen from FIG. 7C. Even though the opposite end portions of the linear beam in the long-side direction are delivered to the semiconductor film, the semiconductor film is not melted and the semiconductor film is inhomogeneously heated. Thus, in this embodiment mode, a slit 703 is provided behind the cylindrical lens 702, whereby the opposite end portions of the linear beam in the long-side direction are blocked (cut). This makes it possible to heat the semiconductor film more homogeneously.

Although one linear beam is formed by using three fiber lasers in this embodiment mode, the present invention is not restricted to this structure. In other words, one linear beam can be formed by using one or more fiber lasers. Moreover, in order to form the laser beams 704 emitted from the three fiber laser oscillators, the structures described in Embodiment Mode 2 and 3 may be appropriately employed. That is, the laser beams coupled or divided by the coupler may be used as the laser beams 704 prior to transmitting through the cylindrical lens array 701.

By using this method, one linear beam can be formed. Moreover, by increasing the number of fiber laser oscillators, a linear beam can be extended unlimitedly-long in principle. Thus, this method makes it possible to manufacture semiconductor devices without lowering productivity even in the case where the size of a substrate with a semiconductor film formed becomes larger.

This embodiment mode can be appropriately combined with any of Embodiment Modes 1 to 4.

Embodiment Mode 7

This embodiment mode will describe an optical system having a different structure from those described in Embodiment Modes 5 and 6.

In this embodiment mode, three exits 503 of laser beams emitted from three fiber laser oscillators through the transmission fiber cables 502 are arranged, and then the laser beams emitted from these three exits 503 are shaped into three linear beams by optical systems. Subsequently, the three linear beams are delivered to a semiconductor film. Moreover, the fiber lasers in this embodiment mode are continuous wave fiber lasers.

An example of an optical system for forming the linear beams is shown in FIGS. 8A and 8B. FIG. 8A is a plan view in which a long-side direction of a linear beam spot formed by an optical system is included in the paper. FIG. 8B is a side view in which a short-side direction of the linear beam spot formed by the optical system is included in the paper. The laser beams emitted from the fiber lasers travel in directions indicated by arrows shown in FIGS. 8A and 8B.

Laser beams 804 emitted from the three exits 503 are shaped into three linear beams having energy distribution shown in FIG. 8C by providing four slits 803 between three cylindrical lenses 801 and a cylindrical lens 802. Since the three linear beams have homogeneous energy distribution in the long-side direction as shown in FIG. 8C, a semiconductor film can be homogeneously heated in each region irradiated with each of the three linear beams.

It is to be noted that a relation of $b=na$ (n: positive integer number) may be satisfied where a is a length of each linear beam in the long-side direction, b is a distance between the linear beams, and m is the number of linear beams. In this case, an irradiation method is as follows: (1) after scanning of the linear beams are repeated (n+1) times in a direction parallel to the short-side direction of the linear beam with a feeding pitch of "a", (2) the substrate or the beam is slid in the long-side direction by the length of (m−1)(n+1)a. By repeating the steps of (1) and (2) alternately to perform irradiation, the whole surface of the semiconductor film formed over the substrate can be crystallized. It is preferable that the scan speed of the linear beams in the step (1) be in the range of 20 to 30 m/s in consideration of crystal growth rate of the semiconductor film (such as silicon). By setting the scan speed of the linear beams in the range of 20 to 30 m/s, crystal growth of the semiconductor film can be carried out in a direction parallel to the long-side direction of the linear beam. In this case, crystal grain boundaries are formed in a direction parallel to the short-side direction of the linear beam. Therefore, for example, if thin film transistors are formed by using the semiconductor film crystallized by the linear beams as their active layers, the active layers are preferably arranged so that a carrier moving direction is parallel to the short-side direction of the linear beam.

Although the three linear beams are formed by using the three fiber lasers in this embodiment mode, the present invention is not restricted to this structure. That is, a plurality of linear beams may be formed by using one or more fiber lasers. Moreover, in order to form the laser beams 804 emitted from the three fiber laser oscillators, the structures described in Embodiment Mode 2 and 3 may be appropriately employed. That is, the laser beams coupled or divided by the coupler may be used as the laser beams 804 prior to transmitting through the cylindrical lens array 801.

By using this method, a plurality of linear beams can be formed. Moreover, by increasing the number of fiber laser oscillators, the number of linear beams having a certain length in the long-side direction can be increased unlimitedly in principle. Thus, this method makes it possible to manufacture semiconductor devices without lowering productivity even in the case where the substrate with the semiconductor film formed is enlarged.

This embodiment mode can be freely combined with any of Embodiment Modes 1 to 4.

Embodiment 1

This embodiment will describe a method for manufacturing a semiconductor device having a semiconductor film formed by using the method described in any of Embodiment Modes 1 to 7, with reference to drawings.

Figure 9A:
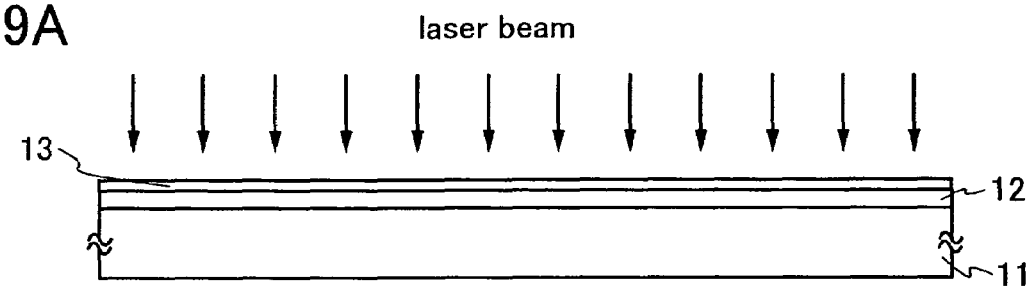
FIGS. 9A to 9C show a method for manufacturing a semiconductor device of the present invention (Embodiment 1)

First, a base film 12 is formed over a substrate 11 (FIG. 9A). By forming the base film 12 over the substrate 11, it is possible to prevent movable ions contained in the substrate 11 that adversely affect characteristics of a semiconductor film, such as ions of an alkali metal or an alkaline earth metal, from diffusing to the semiconductor film.

As the substrate 11, a glass substrate, a quartz substrate, a silicon substrate (wafer), a metal substrate, a ceramic substrate, a stainless steel substrate, a plastic substrate, an acrylic substrate, or the like can be used. Moreover, a heat-resistant plastic substrate that can resist a heat treatment in a manufacturing process for a semiconductor device can be used. Among these substrates, a heat-resistant plastic substrate or a glass substrate is preferable. A glass substrate is not much restricted in size and shape. Thus, in the case of using a glass substrate as the substrate 11, for example, a rectangular substrate with a length of 1 m or more on one side can be easily used, which can drastically increase the productivity. This is a superior point to a circular silicon substrate. Even in terms of cost of a substrate itself, a glass substrate is more preferable than a quartz substrate, a silicon substrate, a metal substrate, a ceramic substrate, a stainless steel substrate, and the like. In particular, when a large substrate is required, the superiority in low cost is so remarkable that a glass substrate is also preferable in consideration of mass productivity. In this embodiment, a glass substrate is used as the substrate 11.

The base film 12 may have either a single-layer or multi-layer structure. As a material for the base film, a silicon oxide film, a silicon nitride film, a silicon oxide film containing nitrogen (a $SiO_xN_y$ film, x>y), a silicon nitride film containing oxygen (a $SiN_xO_y$ film, x>y), or the like can be used. For example, if the base film has a two-layer structure, it is preferable that a silicon nitride film containing oxygen be formed as a first insulating film and a silicon oxide film containing nitrogen be formed as a second insulating film.

Next, an amorphous semiconductor film 13 (such as a film containing amorphous silicon as its main component) is formed over the base film 12. The amorphous semiconductor film 13 is formed in 25 to 200 nm thick (preferably 30 to 150 nm thick) by a sputtering method or various kinds of CVD methods such as a plasma CVD method. It is preferable that the base film 12 and the amorphous semiconductor film 13 be formed continuously without being exposed to the air.

Figure 9B:
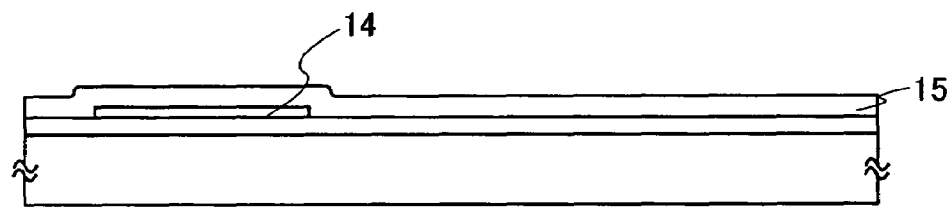

Subsequently, the amorphous semiconductor film 13 is crystallized to form a crystalline semiconductor film. In this embodiment, the amorphous semiconductor film 13 is crystallized in such a way that the amorphous semiconductor film 13 is heated by irradiation with a fiber laser. After that, the obtained crystalline semiconductor film is processed into a desired shape, thereby forming a crystalline semiconductor film 14 (FIG. 9B).

An irradiation condition of the fiber laser also depends on the thickness of a semiconductor film, the laser wavelength, and the oscillation method (continuous wave oscillation or pulsed oscillation). For example, in the case of using an amorphous silicon film with a thickness of 30 to 150 nm as the semiconductor film and a continuous wave laser with a wavelength of 532 nm, a beam profile is set so that the power density ranges from about 0.01 to 100 MW/cm$^2$ (preferably 0.1 to 10 MW/cm$^2$) and the semiconductor film is irradiated with the laser beam at a scan speed of about 10 to 2000 cm/s.

It is to be noted that the fiber laser may be delivered to the amorphous semiconductor film 13 by appropriately using any of the methods described in Embodiment Modes 1 to 7.

Next, a gate insulating film 15 is formed to cover the crystalline semiconductor film 14. The gate insulating film 15 may be formed by a sputtering method or various kinds of CVD methods such as a plasma CVD method. In specific, a silicon oxide film, a silicon nitride film, a silicon oxide film containing nitrogen (a $SiO_xN_y$ film, x>y), or a silicon nitride film containing oxygen (a $SiN_xO_y$ film, x>y) is formed in a single-layer structure, or these films are appropriately stacked. The gate insulating film 15 may be formed in such a way that the crystalline semiconductor film 14 is subjected to a high-density plasma treatment in an atmosphere containing oxygen, nitrogen, or oxygen and nitrogen so that the surface of the crystalline semiconductor film 14 is oxidized or nitrided. The gate insulating film formed by a high-density plasma treatment can be dense and superior to a film formed by a CVD method, a sputtering method, or the like in uniformity of film thickness, film quality, and the like.

In this specification, the high-density plasma treatment refers to a treatment in which the plasma electron density ranges from $1\times10^{11}$ to $1\times10^{13}$ cm$^{-3}$ and the plasma electron temperature ranges from 0.5 to 1.5 eV. The term of "high-density plasma treatment" hereinafter refers to the plasma treatment under the aforementioned condition. Since the plasma electron density is high while the electron temperature in the vicinity of an object to be processed (metal film) formed over the substrate is low, plasma damage to the substrate can be prevented. Moreover, since the plasma electron density is as high as $1\times10^{11}$ cm$^{-3}$ or more, a dense film superior in uniformity of film thickness can be formed using an oxide formed by an oxidation treatment using the high-density plasma treatment. Further, since the plasma electron temperature is as low as 1.5 eV or less, the oxidation treatment can be carried out at lower temperature than a plasma treatment or a thermal oxidation method. For example, a plasma oxidation treatment can be carried out sufficiently even by a plasma treatment at a temperature that is 100° C. or more lower than a distortion temperature of a glass substrate (typically 250 to 550° C.). The power supply frequency for forming plasma is a microwave (2.45 GHz). The plasma has a potential as low as 5 V or less, whereby excessive dissociation of material molecules can be suppressed.

As the atmosphere containing oxygen, the followings can be given: a mixed gas of a noble gas and one of oxygen ($O_2$), nitrogen dioxide ($NO_2$), and dinitrogen monoxide ($N_2O$); and a mixed gas of a noble gas, hydrogen ($H_2$), and one of oxygen ($O_2$), nitrogen dioxide ($NO_2$), and dinitrogen monoxide ($N_2O$). As the atmosphere containing nitrogen, the followings can be given: a mixed gas of a noble gas and one of nitrogen ($N_2$) and ammonia ($NH_3$); and a mixed gas of a noble gas, hydrogen ($H_2$), and one of nitrogen ($N_2$) and ammonia ($NH_3$). The surface of the crystalline semiconductor film 14 can be oxidized or nitrided by oxygen radicals (which may contain OH radicals) or nitrogen radicals (which may contain NH radicals) generated by the high-density plasma.

In the case of forming the gate insulating film 15 by the high-density plasma treatment, an insulating film is formed in 1 to 20 nm thick, typically 5 to 10 nm thick over the crystalline semiconductor film 14. Since the reaction in this case is a solid-phase reaction, interface state density between the insulating film and the crystalline semiconductor film 14 can be made considerably low. Moreover, since the crystalline semiconductor film 14 is directly oxidized or nitrided, variation in the thickness of the gate insulating film 15 can be ideally made extremely low. Moreover, since strong oxidation does not occur even at crystal grain boundaries of crystalline silicon, the condition becomes very favorable. In other words, by solid-phase oxidizing the surface of the semiconductor film in the high-density plasma treatment shown here, the insulating film with favorable uniformity and low interface state density can be formed without causing an abnormal oxidation reaction at the crystal grain boundaries.

The gate insulating film 15 may be only the insulating film formed by the high-density plasma treatment or may be multilayer formed by stacking, in addition to the aforementioned insulating film, another insulating film such as a silicon oxide film, a silicon nitride film containing oxygen, or a silicon oxide film containing nitrogen by a CVD method using plasma or thermal reaction. In any way, a transistor formed by including the insulating film formed by the high-density plasma treatment partially or wholly in the gate insulating film can have lower variation in its characteristics.

The crystalline semiconductor film 14 crystallized in such a way that the amorphous semiconductor film 13 is irradiated with the continuous wave fiber laser beam while scanning the laser beam in one direction has such a characteristic that crystals grow in the scanning direction of the laser beam. Therefore, when a transistor is provided so that a channel length direction thereof (a direction where carriers flow when a channel formation region is formed) is in accordance with the scanning direction and the gate insulating film 15 formed by the high-density plasma treatment is combined, the transistor can have lower variation in its characteristics and high electric field effect mobility.

Figure 9C:
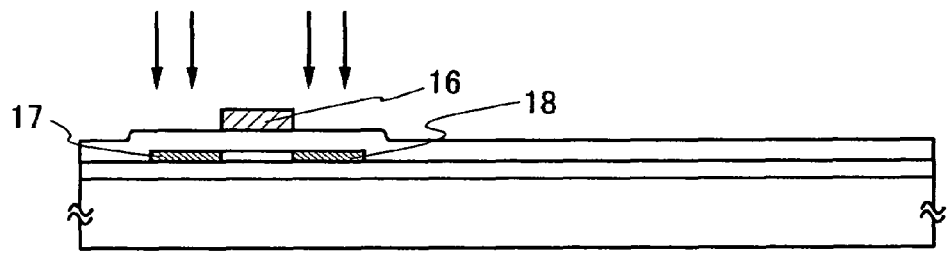

Next, a conductive film is formed over the gate insulating film 15 and then the conductive film is etched using a mask, thereby forming a gate electrode 16 (FIG. 9C). The conductive film may be formed by a sputtering method or various kinds of CVD methods such as a plasma CVD method. As a material for the conductive film, an element selected from tantalum (Ta), tungsten (W), titanium (Ti), molybdenum (Mo), aluminum (Al), copper (Cu), chromium (Cr), and niobium (Nb), or an alloy or compound material containing the element as its main component can be used. Moreover, a semiconductor material typified by polysilicon, which is doped with an impurity element such as phosphorus, can be used.

The gate electrode 16 may have not only a single-layer structure but also a two-layer structure of a first conductive film and a second conductive film, or moreover a three-layer structure. Even in the case of a two-layer or three-layer structure, materials similar to those aforementioned as the conductive film may be selected freely. For example, if the gate electrode 16 has a two-layer structure, the first conductive film is formed in 20 to 100 nm thick and the second conductive film is formed in 100 to 400 nm thick. As an example of combination of the first conductive film and the second conductive film, a tantalum nitride film and a tungsten film, a tungsten nitride film and a tungsten film, a molybdenum nitride film and a molybdenum film, and so on are given. Since tungsten and tantalum nitride have high heat resistance, a heat treatment can be carried out for thermal activation after forming the first conductive film and the second conductive film.

Next, a source region and a drain region are formed by adding an impurity element imparting N-type or P-type conductivity to the crystalline semiconductor film 14, using the gate electrode 16 as a mask. In this way, an N-channel or P-channel type thin film transistor is completed. As the addition method, an ion doping method or an ion implantation method may be used. As the impurity element imparting N-type conductivity, an element belonging to Group 15 may be used; for example, phosphorus (P) or arsenic (As) may be used. As the impurity element imparting P-type conductivity, an element belonging to Group 13 may be used; for example, boron (B) may be used.

Although this embodiment has described a top-gate thin film transistor, a bottom-gate thin film transistor may also be formed. Moreover, although a single-gate structure in which one channel formation region is formed in a thin film transistor has been described in this embodiment, a double-gate structure in which two channel formation regions are formed or a triple-gate structure in which three channel formation regions are formed is also applicable. Moreover, a dual-gate structure may be used in which two gate electrodes are formed over and under a channel forming region with gate insulating films interposed therebetween.

The structure of the semiconductor film that constitutes a part of the thin film transistor may be different from that described in this embodiment. For example, a structure including an LDD (Lightly Doped Drain) region, or a GOLD (Gate-drain Overlapped LDD) structure may be used. Further, an insulating film (sidewall) may be formed in contact with a side surface of a gate electrode provided above or below the semiconductor film. Furthermore, a structure in which a silicide region is formed over a part or the whole region of a top surface of source and drain regions may also be employed.

After the thin film transistor is completed by the above steps, a heat treatment is preferably carried out for recovery of the crystallinity of the semiconductor film or for activation of the impurity element added to the semiconductor film. For example, it is preferable to activate the impurity element by irradiating the source region and the drain region with a fiber laser. By using a method in which irradiation with a fiber laser is carried out, activation can be conducted with high productivity and at low cost.

In this embodiment, the amorphous semiconductor film is crystallized by using the fiber laser to manufacture the thin film transistor. Therefore, the thin film transistor can be manufactured at low cost.

This embodiment can be appropriately combined with any of the embodiment modes.

Embodiment 2

With reference to drawings, this embodiment will describe a method for manufacturing a light-emitting device having a semiconductor film formed by the method described in any of Embodiment Modes 1 to 7.

A thin film transistor is formed in accordance with Embodiment 1. It is to be noted that, in this embodiment, a silicon film is used as an active layer of the thin film transistor. The silicon film is obtained in such a way that an amorphous silicon film is crystallized by being irradiated with a linear beam formed by shaping a laser beam or laser beams emitted from one or more fiber lasers through an optical system. Thus, in comparison with crystallization using a solid laser, the light-emitting device can be manufactured at low cost without lowering productivity even though the substrate becomes larger.

Figure 10A:
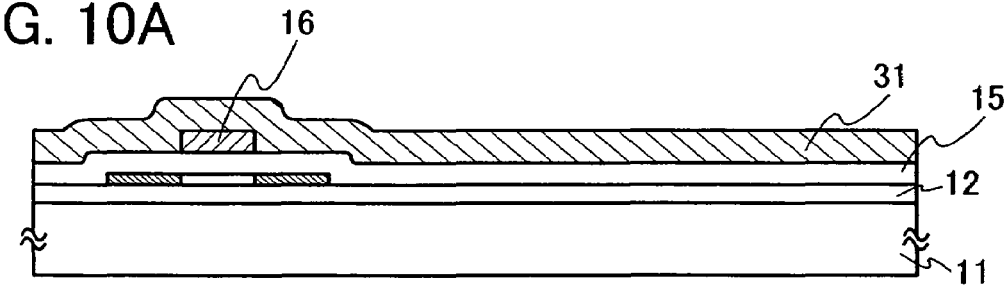
FIGS. 10A to 10D show a method for manufacturing a semiconductor device of the present invention (Embodiment 2)
Figure 10B:
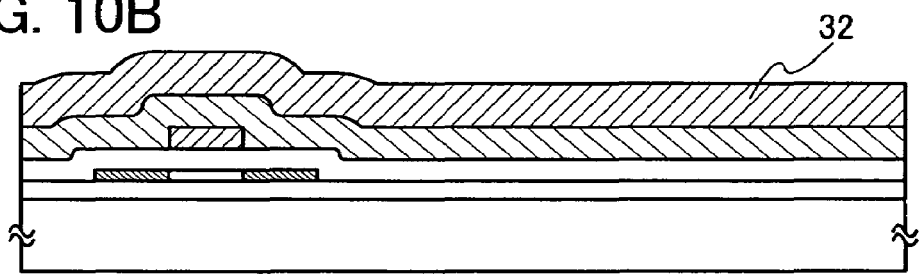

Next, an interlayer insulating film 31 is formed covering the gate insulating film 15 and the gate electrode 16 of the thin film transistor (FIG. 10A). After forming the interlayer insulating film 31, a heat treatment is preferably carried out for about one hour at 450 to 500° C. for activation of the impurity element and hydrogenation of the crystalline semiconductor film 14. Subsequently, an interlayer insulating film 32 is formed over the interlayer insulating film 31 (FIG. 10B). The interlayer insulating film 31 and the interlayer insulating film 32 can be formed using a silicon oxide film, a silicon nitride film, a silicon oxide film containing nitrogen ($SiO_xN_y$ film, x>y), a silicon nitride film containing oxygen ($SiN_xO_y$, x>y), acrylic, polyimide, a low-k material, siloxane, or the like. Siloxane is a material of which skeletal structure includes a bond of silicon and oxygen, and which has, as a substituent, an organic group containing at least hydrogen (such as an alkyl group or an aryl group), a fluoro group, or an organic group containing at least hydrogen and a fluoro group. In this embodiment, the two-layer structure of the interlayer insulating film 31 and the interlayer insulating film 32 is employed; however, a single-layer structure is also applicable.

Figure 10C:
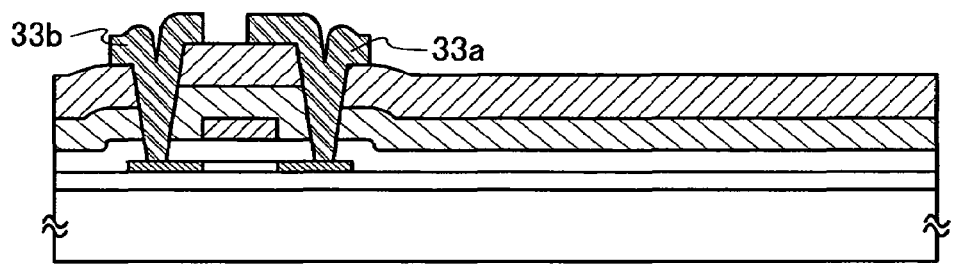

Next, contact holes that reach the crystalline semiconductor film 14 which contains a source region 17 and a drain region 18 are formed (FIG. 10C). These contact holes can be formed by etching using a resist mask until the crystalline semiconductor film 14 is exposed. Either dry etching or wet etching can be used. Depending on the condition, etching may be carried out only once or multiple times. In the latter case, both of dry etching and wet etching may be carried out.

Next, after forming a conductive film which covers the contact holes and the interlayer insulating film 32, this conductive film is processed into a desired shape to form a wire 33a and a wire 33b. These wires 33a and 33b may have a single-layer structure using aluminum; copper; an alloy of aluminum, carbon, and nickel; an alloy of aluminum, carbon, and molybdenum; or the like or may have a multilayer structure in which molybdenum, aluminum, and molybdenum are stacked in order from the substrate side; in which titanium, aluminum, and titanium are stacked in order from the substrate side; or in which titanium nitride, aluminum, and titanium are stacked in order from the substrate side.

Figure 10D:
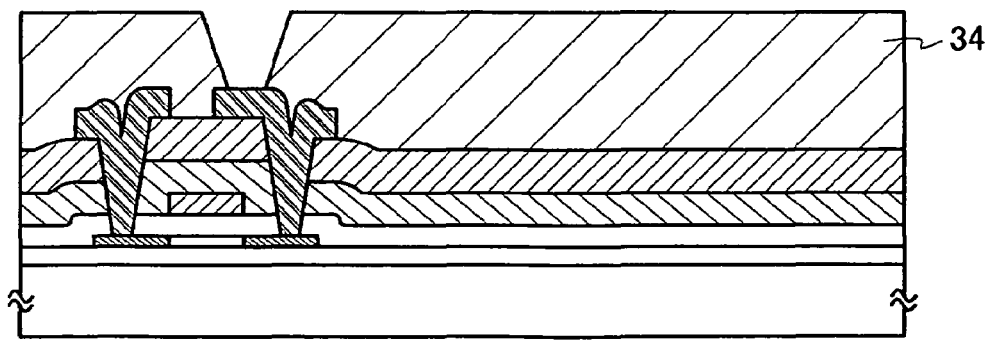

Next, an interlayer insulating film 34 is formed covering the wires 33a and 33b and the interlayer insulating film 32 (FIG. 10D). As a material for the interlayer insulating film 34, a film formed by applying acrylic, polyimide, siloxane, or the like which has a self-flattening property is preferably used. In this embodiment, the interlayer insulating film 34 is formed with siloxane.

An insulating film such as a silicon nitride film may be formed over the interlayer insulating film 34. By forming the insulating film, it is possible to prevent the interlayer insulating film 34 from being overetched when etching is later carried out to form a conductive film functioning as a pixel electrode. Thus, the insulating film is not necessarily provided in the case where the ratio of etching rate between the interlayer insulating film 34 and the conductive film functioning as a pixel electrode is high enough.

Figure 11A:
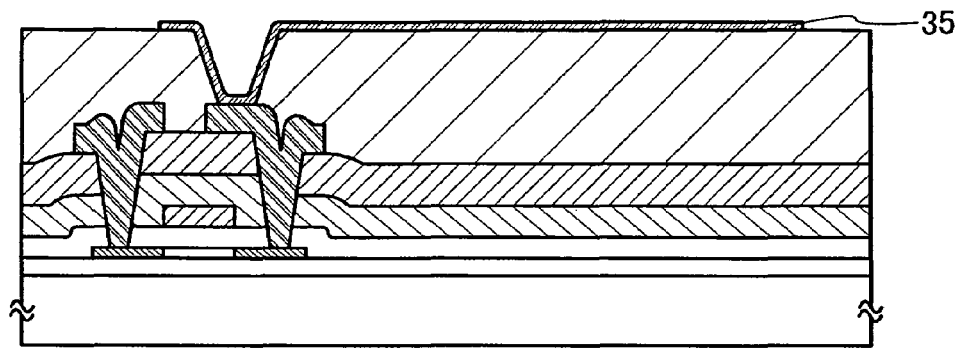
FIGS. 11A to 11C show a method for manufacturing a semiconductor device of the present invention (Embodiment 2)

Next, a contact hole that reaches the wire 33a through the interlayer insulating film 34 is formed. Subsequently, after forming a conductive film having a light-transmitting property to cover the contact hole and the interlayer insulating film 34 (or the insulating film), the conductive film having a light-transmitting property is etched into a desired shape to form a first electrode 35 of the light-emitting element (FIG. 11A). The first electrode 35 is connected to the wire 33a. In this specification, the term of "connection" includes electric connection. Thus, another wire and the like may be formed in between.

The first electrode 35 can be formed with a metal such as aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), or titanium (Ti). Moreover, an alloy of aluminum and silicon, an alloy of aluminum and titanium, an alloy of aluminum, silicon, and copper may be used. Further, a nitride containing a metal, such as titanium nitride, or an oxide containing metal, such as an oxide containing indium and tin (ITO: Indium Tin Oxide), an oxide containing indium, tin, and silicon (ITSO: Indium Tin Silicon Oxide), or an oxide in which 2 to 20 at % of zinc oxide is mixed with indium oxide (IZO: Indium Zinc Oxide) can be used.

The electrode from the side of which light is to be extracted needs to be formed by a conductive film having a light-transmitting property. In this embodiment, in order that light can be emitted from a bottom side of the first electrode 35, a conductive film having a light-transmitting property is formed as the first electrode 35. As the conductive film having a light-transmitting property, an ultrathin film including metal such as aluminum or silver can be used besides an oxide containing indium and tin (ITO: Indium Tin Oxide), an oxide containing indium, tin, and silicon (ITSO: Indium Tin Silicon Oxide), or an oxide in which 2 to 20 at % of zinc oxide is mixed with indium oxide (IZO: Indium Zinc Oxide). Moreover, in order that light is emitted from a top side of a later-formed second electrode 38, the first electrode 35 can be formed with a material having high reflectivity (such as aluminum or silver). In this embodiment, the first electrode 35 is formed with ITSO. ITSO is not crystallized but remains amorphous even after baking, differently from ITO. Thus, when the first electrode 35 is formed with ITSO, since ITSO has higher flatness than ITO, it is possible to suppress short-circuiting of the first electrode 35 and the later-formed second electrode 38 even though a later-formed electroluminescent layer 37 is thin.

Figure 11B:
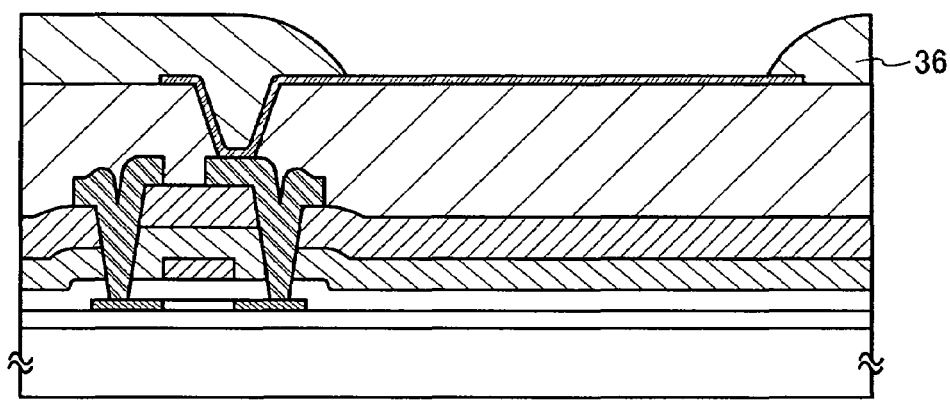

Next, an insulating film is formed with an organic material or an inorganic material so as to cover the interlayer insulating film 34 (or the insulating film) and the first electrode 35. Subsequently, the insulating film is processed so as to expose a part of the first electrode 35, thereby forming a partition wall 36. That is, the partition wall 36 is formed so as to cover the interlayer insulating film 34 and the end portion of the first electrode 35. As a material for the partition wall 36, a photosensitive organic material (such as acrylic or polyimide) or siloxane is preferable. Moreover, a nonphotosensitive organic material or inorganic material can also be used. In addition, the partition wall 36 may be formed by dispersing black pigment or dye such as titanium black or carbon nitride into the material of the partition wall 36 to make the partition wall 36 black so that the partition wall 36 functions as black matrix. It is desirable that an end surface of the partition wall 36 toward the first electrode 35 have a tapered shape whose curvature continuously changes (FIG. 11B).

Figure 11C:
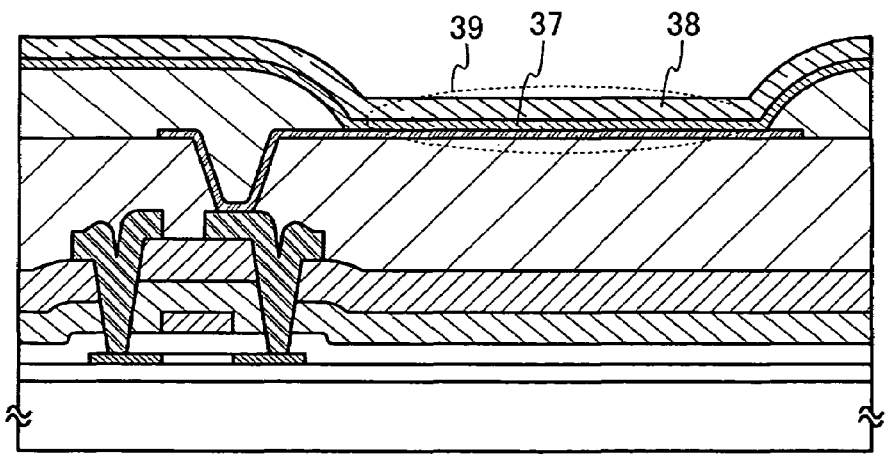

Next, the electroluminescent layer 37 is formed covering the first electrode 35 and the partition wall 36. Subsequently, the second electrode 38 is formed over the electroluminescent layer 37. Thus, a light-emitting element 39 can be manufactured in which the electroluminescent layer 37 is sandwiched between the first electrode 35 and the second electrode 38 (FIG. 11C). The second electrode 38 may be formed with a similar material to the first electrode 35. In this embodiment, the second electrode 38 is formed with aluminum.

The electroluminescent layer 37 may be formed by an evaporation method, a droplet discharging method (such as an ink jet method), a spin coating method, a dip coating method, or the like. The electroluminescent layer 37 may be formed with an organic compound in a single-layer or multilayer structure or may be formed using an organic compound film partially including an inorganic compound. If the first electrode 35 is used as an anode and the second electrode 38 is used as a cathode, the electroluminescent layer 37 may have, for example, a structure in which an HIL (hole-injecting layer), an HTL (hole-transporting layer), an EML (light-emitting layer), an ETL (electron-transporting layer), and an EIL (electron-injecting layer) are stacked in order from the first electrode 35 (anode) side. If the first electrode 35 is used as a cathode and the second electrode 38 is used as an anode, the electroluminescent layer 37 may have, for example, a structure in which an EIL (electron-injecting layer), an ETL (electron-transporting layer), an EML (light-emitting layer), an HTL (hole-transporting layer), and an HIL (hole-injecting layer) are stacked in order from the first electrode 35 (cathode) side.

Next, a passivation film is formed using a silicon nitride film, a diamond-like carbon film, a silicon oxide film containing nitrogen, or the like. In the case of using a silicon oxide film containing nitrogen as the passivation film, a plasma CVD method may be used by employing a mixed gas containing $SiH_4$, $N_2O$, and $NH_3$; a mixed gas containing $SiH_4$ and $N_2O$; or a mixed gas in which $SiH_4$ and $N_2O$ are diluted with Ar as a material. The passivation film may have not only a single-layer structure but also a multilayer structure. For example, a multilayer structure of a carbon nitride film and a silicon nitride film may be used.

Subsequently, in order to protect the light-emitting element 39 from deterioration-promoting substances such as water, a display portion is sealed. In the case of using a counter substrate for the sealing, the element substrate and the counter substrate are pasted to each other by an insulating sealing material so that an external connection portion is exposed. A space between the counter substrate and the element substrate may be filled with an inert gas such as dry nitrogen, or the sealing material may be applied to the whole surface of the pixel portion by which the counter substrate and the element substrate are pasted to each other. The sealing material is preferably formed with an ultraviolet curable resin. In the sealing material, a drying agent or particles for keeping the distance between the substrates constant may be mixed. Finally, the light-emitting device is completed by pasting a flexible wiring substrate to the external connection portion.

An example of the thus manufactured light-emitting device will be described with reference to FIG. 12. It is to be noted that portions which do not have the same shape but have similar functions are denoted by the same reference numeral and description of such portions is omitted. In this embodiment, the thin film transistor is connected to the light-emitting element 39 through the wire 33a.

The first electrode 35 is formed using a conductive film having a light-transmitting property and has a structure in which light emitted from the electroluminescent layer 37 is extracted to the substrate 11 side. A reference numeral 42 denotes a counter substrate which will be fixed to the substrate 11 by using a sealing material or the like after forming the light-emitting element 39. A space between the counter substrate 42 and the element is filled with a resin 40 having a light-transmitting property and the like and sealed, whereby the light-emitting element 39 can be prevented from deteriorating due to moisture. It is desirable that the resin 40 have a moisture-absorption property. Moreover, by dispersing a drying agent 41 having a high light-transmitting property in the resin 40, an effect of moisture can be suppressed further.

Figure 12:
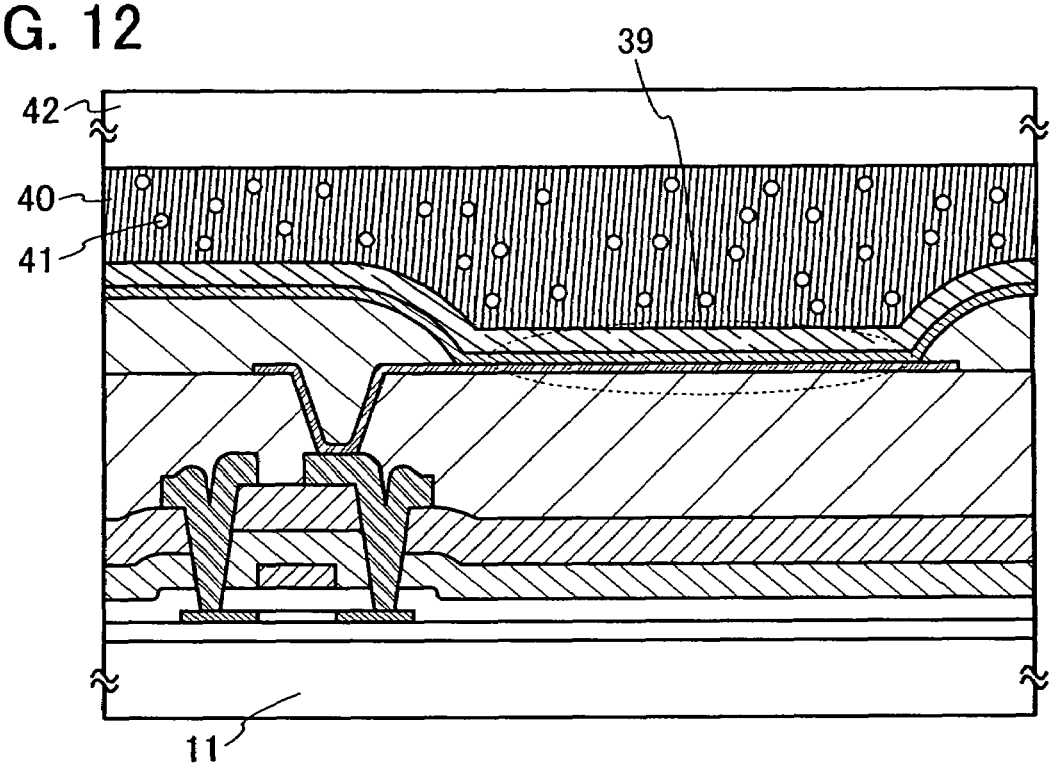
FIG. 12 shows a method for manufacturing a semiconductor device of the present invention (Embodiment 2)

In FIG. 12, both the first electrode 35 and the second electrode 38 are formed by conductive films having a light-transmitting property and light can be extracted from both the substrate 11 and the counter substrate 42 sides. In this structure, it is preferable to provide polarizing plates outside the substrate 11 and the counter substrate 42, so that a screen can be prevented from becoming transparent and visibility can be improved. Moreover, protective films are preferably provided outside the polarizing plates.

Either an analog video signal or a digital video signal may be used in the light-emitting device having a display function according to the present invention. A digital video signal includes a video signal using voltage and a video signal using current. When the light-emitting element emits light, a video signal inputted to the pixel uses constant voltage or constant current. When the video signal uses constant voltage, the voltage applied to the light-emitting element or the current flowing in the light-emitting element is constant. On the other hand, when the video signal uses constant current, the voltage applied to the light-emitting element or the current flowing in the light-emitting element is constant. The light-emitting element to which the constant voltage is applied is driven by constant voltage, and the light-emitting element in which the constant current flows is driven by constant current. The constant current flows in the light-emitting element driven by the constant current without being affected by the change of the resistance of the light-emitting element. Any of the aforementioned driving methods may be employed in the light-emitting display device of the present invention.

This embodiment can be appropriately combined with any of the aforementioned embodiment modes and embodiment.

Embodiment 3

Figure 13A:
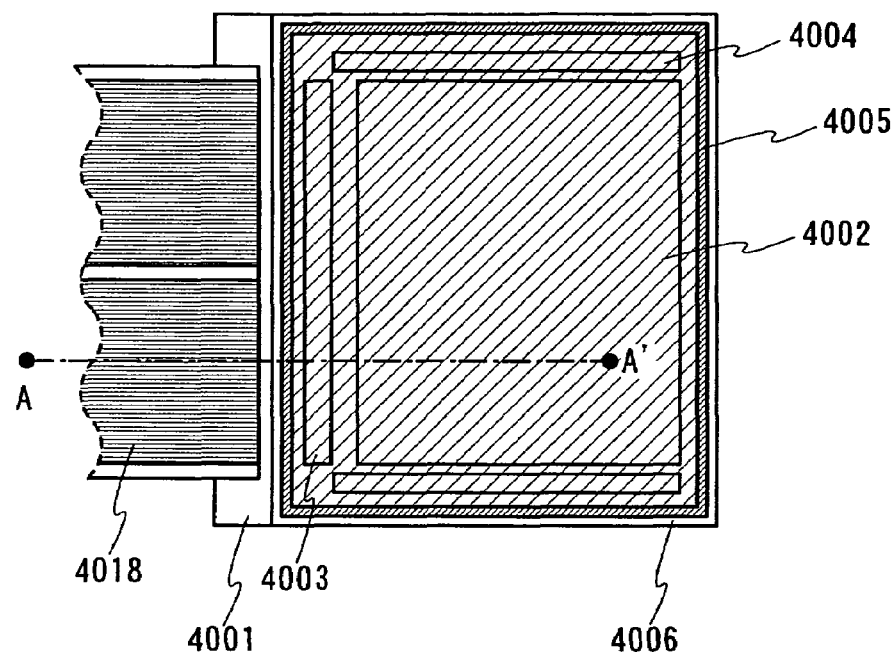
FIGS. 13A and 13B show a method for manufacturing a semiconductor device of the present invention (Embodiment 3)
Figure 13B:
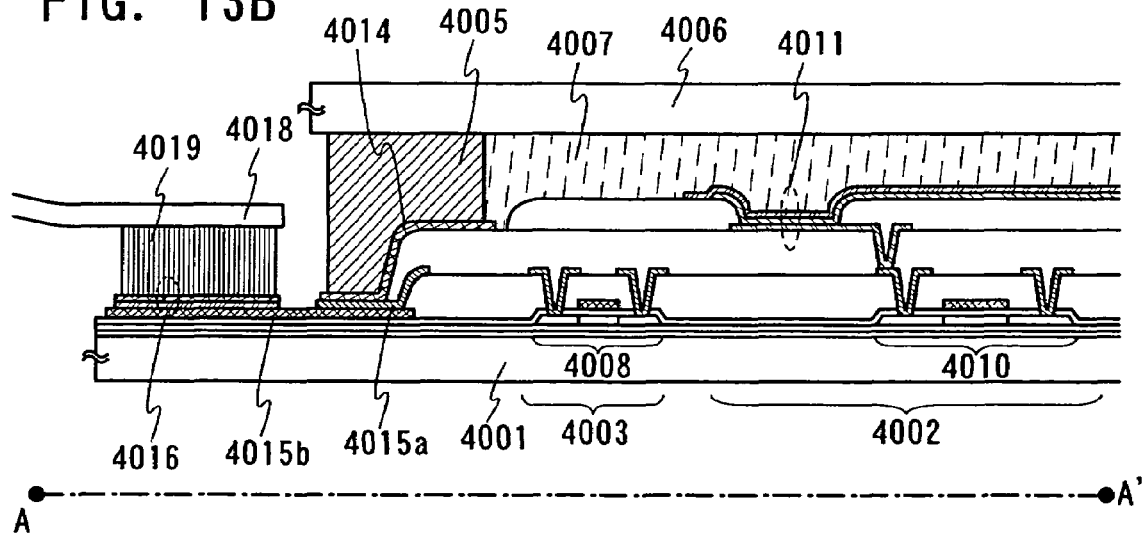

This embodiment will describe an external appearance of a panel which is a light-emitting device of the present invention, with reference to FIGS. 13A and 13B. FIG. 13A is a top view of a panel in which a light-emitting element 4011 is sealed by a sealing material 4005 formed between a substrate 4001 and a counter substrate 4006. FIG. 13B corresponds to a cross-sectional view along a line A-A' of FIG. 13A.

The sealing material 4005 is provided so as to surround a pixel portion 4002, a signal line driver circuit 4003, and a scanning line driver circuit 4004 which are provided over a substrate 4001 as shown in FIG. 13A. In addition, the counter substrate 4006 is provided over the pixel portion 4002, the signal line driver circuit 4003, and the scanning line driver circuit 4004. The pixel portion 4002, the signal line driver circuit 4003, and the scanning line driver circuit 4004 are tightly sealed by the sealing material 4005 between the counter substrate 4006 and the substrate 4001 together with a filling material 4007.

The pixel portion 4002, the signal line driver circuit 4003, and the scanning line driver circuit 4004 provided over the substrate 4001 each have a plurality of thin film transistors. FIG. 13B shows a thin film transistor 4008 included in the signal line driver circuit 4003 and a thin film transistor 4010 included in the pixel portion 4002. The light-emitting element 4011 is connected electrically to the thin film transistor 4010.

Further, a wire 4014 corresponds to a wire for supplying a signal or a power supply voltage to the pixel portion 4002, the signal line driver circuit 4003, and the scanning line driver circuit 4004. The wire 4014 is connected to a connection terminal 4016 through a wire 4015. The connection terminal 4016 is electrically connected to a terminal of a flexible print circuit (FPC) 4018 through an anisotropic conductive film 4019.

As the filling material 4007, in addition to an inert gas such as nitrogen or argon, an ultraviolet curable resin or a thermoset resin can be used. For example, polyvinyl chloride, acrylic, polyimide, an epoxy resin, a silicon resin, polyvinyl butyral, or ethylene vinylene acetate can be used.

It is to be noted that the light-emitting device according to the present invention includes in its category the panel in which the pixel portion having the light-emitting element is formed and a module in which an IC is mounted on the panel.

This embodiment can be appropriately combined with any of the aforementioned embodiment modes and embodiments.

Embodiment 4

This embodiment will describe a structure of a method for manufacturing an RFID (Radio Frequency Identification) tag capable of sending and receiving data without contact, with reference to drawings. It is to be noted that an RFID tag can also be referred to as a semiconductor device having an antenna.

Figure 14A:
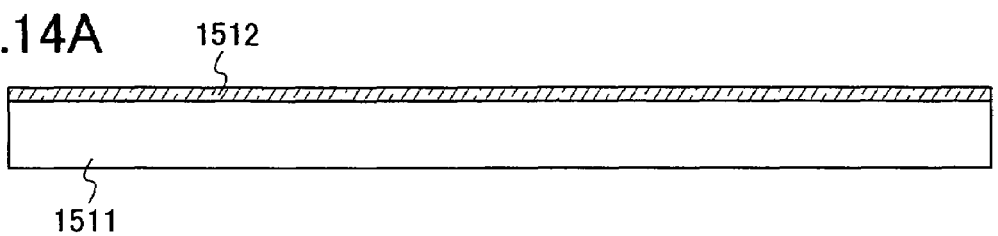
FIGS. 14A to 14D show a method for manufacturing a semiconductor device of the present invention (Embodiment 4)

First, a separation layer 1512 is formed over a substrate 1511 (FIG. 14A). An insulating film may be provided over the substrate 1511 prior to forming the separation layer 1512. In particular, in the case where contamination by impurities such as an alkali metal or an alkaline earth metal contained in the substrate 1511 is a concern, an insulating film is preferably formed between the substrate 1511 and the separation layer 1512. The insulating film provided between the substrate 1511 and the separation layer 1512 may have a single-layer structure using silicon oxide, silicon nitride, silicon oxide containing nitrogen ($SiO_xN_y$, $x>y$), silicon nitride containing oxygen ($SiN_xO_y$, $x>y$), or the like or may have a structure in which these films are stacked. As the substrate 1511, the substrates shown in Embodiment 1 can be used.

The separation layer 1512 can be formed with an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy or compound material containing the element as its main component. As a film-formation method, a sputtering method or various kinds of CVD methods such as a plasma CVD method can be used. Moreover, the separation layer 1512 may have either a single-layer or multilayer structure. For example, after forming tungsten (W) in 20 to 40 nm thick by a sputtering method, a surface of the tungsten (W) is preferably oxidized. As a method for oxidizing the surface of the tungsten (W), after forming tungsten (W), the surface may be directly plasma-oxidized, or after forming tungsten (W), a silicon oxide film may be formed in contact with the tungsten (W). In the latter case, the surface of tungsten (W) is naturally oxidized when the silicon oxide film is formed, so that a metal oxide film is formed. It is to be noted that tungsten oxide is represented by $WO_x$, wherein x ranges from 2 to 3. The x may be 2 ($WO_2$), 2.5 ($W_2O_5$), 2.75 ($W_4O_{11}$), 3 ($WO_3$), or the like. The aforementioned x is not particularly restricted when tungsten oxide is formed, and the composition ratio may be determined based on the etching rate or the like.

Figure 14B:
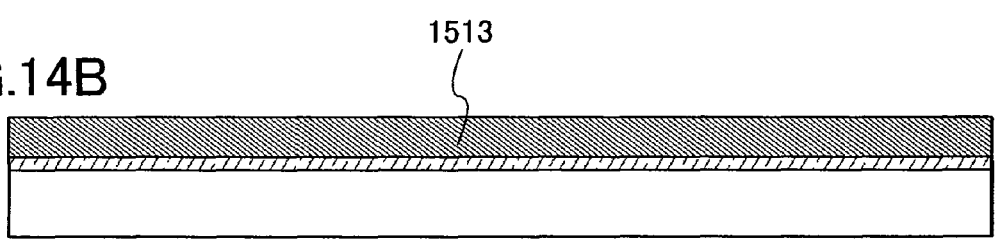

Next, a layer 1513 in which a plurality of integrated circuits each having an element such as a thin film transistor are provided (the layer 1513 is hereinafter referred to as an element layer 1513) is formed over the separation layer 1512 (FIG. 14B). If contamination of the element layer 1513 by impurities or the like from the substrate 1511 is a concern, a base film is preferably provided between the substrate 1511 and the element layer 1513. For example, in the case of using a glass substrate as the substrate 1511, providing the base film can prevent an alkali metal such as sodium (Na) included in the glass substrate from entering the element layer 1513. The base film can be formed with the material shown in Embodiment 1.

The element layer 1513 includes a plurality of integrated circuits, and the plurality of integrated circuits are divided afterward to form parts of semiconductor devices (chips). In other words, the later-formed semiconductor devices include layers with at least integrated circuits formed. The integrated circuit has at least an element typified by a thin film transistor (TFT), a resistor, or the like, and by using the element, various kinds of integrated circuits such as a CPU, a memory, and a microprocessor can be formed. The element layer 1513 can have a mode having an antenna in addition to the element such as a thin film transistor. For example, the integrated circuit formed by a thin film transistor can operate by using an AC voltage generated at an antenna and modulates an AC voltage applied to the antenna, whereby an electromagnetic wave or an electric wave can be sent to a reader/writer. The antenna may be formed together with the thin film transistor or may be formed separately from the thin film transistor and connected electrically later.

In this embodiment, the thin film transistor is formed in such a way that a semiconductor film is crystallized by using a fiber laser by the method shown in the above embodiment modes. The semiconductor film of the thin film transistor may have any structure; for example, an impurity region (including a source region, a drain region, and an LDD region) may be formed, or a P-channel, N-channel, or CMOS circuit may be formed. Further, an insulating film (sidewall) may be formed in contact with a side surface of a gate electrode provided above or below the semiconductor film. Alternatively, a silicide layer of nickel, molybdenum, cobalt, or the like may be formed for one or both of the source and drain regions and the gate electrode.

Figure 14C:
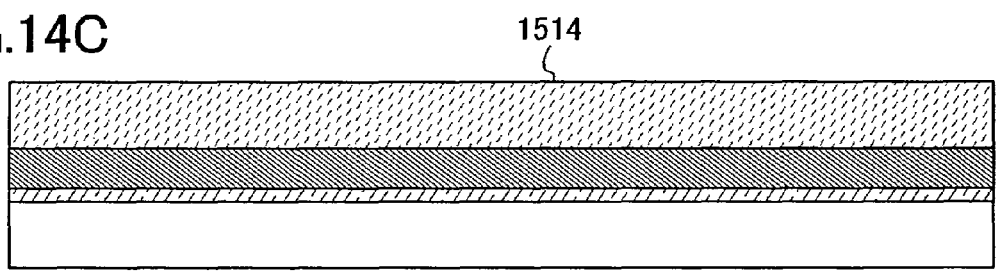

Subsequently, an insulating film 1514 is formed so as to cover the element layer 1513 (FIG. 14C) as necessary. This insulating film 1514 only needs to function as a protective layer for ensuring strength of the element layer 1513, and the insulating film 1514 is preferably provided over the entire surface so as to cover the element layer 1513; however, the insulating layer 1514 is not necessarily provided over the entire surface but may be provided selectively. The insulating film 1514 can be formed using a film containing carbon such as a DLC (diamond-like carbon) film, a silicon oxide film containing nitrogen, a silicon nitride film containing oxygen, or a film containing an organic material (such as a resin material like epoxy). The insulating film 1514 can be formed by a sputtering method, various kinds of CVD methods such as a plasma CVD method, a spin coating method, a droplet discharging method, a printing method, or the like. Although the insulating film 1514 is provided in this embodiment, the present invention is also applicable to a structure where the insulating film 1514 is not provided.

Figure 14D:
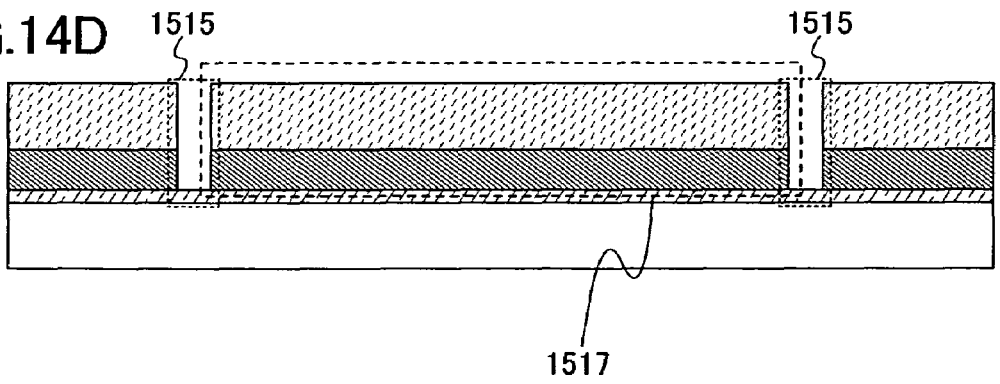

Next, the element layer 1513 and the insulating film 1514 are partially etched to form opening portions 1515 which expose the separation layer 1512 (FIG. 14D). By forming the opening portions 1515, a plurality of layers that are partially constituted by the element layer 1513 and the insulating film 1514 (hereinafter the layers are referred to as a multilayer body 1517) are formed. The element layer 1513 divided by the opening portions 1515 can be called a layer in which the integrated circuit is provided.

The opening portions 1515 are formed to selectively (partially) lower adhesion between the separation layer 1512 and the element layer 1513 and trigger separation of the element layer 1513 and the insulating film 1514 from the substrate 1511 later. The opening portions 1515 can be formed by laser irradiation, a photolithography method, or the like. Further, the opening portions 1515 are preferably provided in a region other than the thin film transistor that forms the element layer 1513 and the like or in an end portion of the substrate 1511.

In the case of using a laser for this process, any of a gas laser, a liquid laser, and a solid laser can be used. However, it is preferable to use a gas laser or a solid laser, and more preferable to use a solid laser.

As a gas laser, a helium-neon laser, a carbon dioxide ($CO_2$) gas laser, an excimer laser, and an argon ion laser are given. As an excimer laser, a noble gas excimer laser and a noble gas halide excimer laser are given. As the noble gas excimer laser, oscillation is generated by any of three kinds of excitation molecules: argon, krypton, and xenon. As an argon ion laser, a noble gas ion laser and a metal evaporation ion laser are given.

As a liquid laser, an inorganic liquid laser, an organic chelate laser, and a dye laser are given. An inorganic liquid laser and an organic chelate laser use, as a laser medium, a rare-earth ion such as neodymium utilized in a solid laser.

A laser medium of a solid laser is a solid base material which has been doped with an active species which performs laser operation. As the base material, a crystal or glass can be used. As the crystal, YAG (yttrium-aluminum-garnet crystal), YLF, $YVO_4$, $YAlO_3$, sapphire, ruby, and alexandrite can be given. As the active species that performs laser operation, for example, a trivalent ion (such as $Cr^{3+}$, $Nd^{3+}$, $Yb^{3+}$, $Tm^{3+}$, $Ho^{3+}$, $Er^{3+}$, or $Ti^{3+}$) can be used. Besides those, a semiconductor laser, a disk laser, or a fiber laser can be used.

The laser may be either a continuous wave laser or a pulsed laser. An irradiation condition of a laser beam, such as repetition rate, power density, energy density, and a beam profile may be appropriately adjusted in consideration of properties, thickness, and the like of the material used for the element layer 1513 and the insulating film 1514.

In the aforementioned step of laser irradiation, ablation processing is used. The ablation processing utilizes a phenomenon in which a molecule bond is cut in a portion irradiated with a laser beam, i.e., a portion in which a laser beam is absorbed, and then the portion is photolyzed and evaporated. That is, in this step, molecule bonds of the insulating film provided for the element layer 1513 and the insulating film 1514 and the like are cut by laser irradiation, and the portion is photolyzed and evaporated, thereby forming the opening portions 1515.

As the laser, it is preferable to use a solid laser with a wavelength of 133 to 355 nm which is in an ultraviolet region (more preferably 212 to 355 nm). For example, a Nd: $YVO_4$ laser with a wavelength of 133 to 355 nm is preferably used. A Nd: $YVO_4$ laser with a wavelength of 133 to 355 nm is preferable because light is absorbed in a substrate more easily than other laser beams with longer wavelengths, ablation processing is possible, a periphery of a portion to be processed is not affected, and workability is favorable.

Figure 15A:
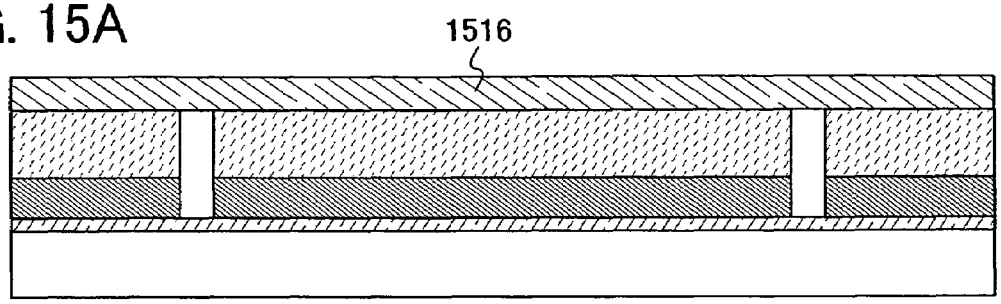
FIGS. 15A to 15C show a method for manufacturing a semiconductor device of the present invention (Embodiment 4)

Next, a film 1516 is pasted onto the insulating film 1514 (FIG. 15A). The film 1516 functions to secure space between the semiconductor devices when the semiconductor devices are separated from the film 1516 later. As the film 1516, a stretch film (also called an expand film) is preferably used. Moreover, a film in which a film protecting the element layer 1513 and an expand film are stacked may be used. The film 1516 preferably has such a property that adhesion is high in a normal state but becomes lower by light irradiation. For example, a UV tape of which adhesion gets lower by ultraviolet light irradiation may be used.

Figure 15B:
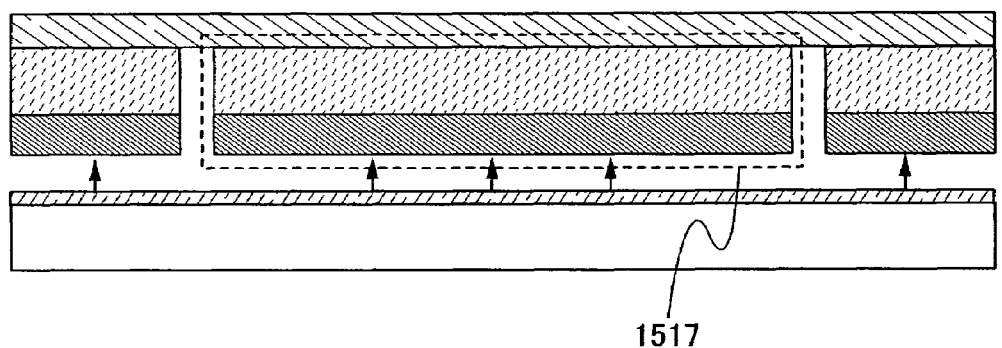

Subsequently, the element layer 1513 and the insulating film 1514 are separated from the substrate 1511 by a physical means (FIG. 15B). Since the adhesion between the separation layer 1512 and the element layer 1513 is selectively (partially) lowered by forming the opening portions 1515 prior to the separation, the element layer 1513 and the insulating film 1514 can be easily separated from the substrate 1511 by a physical means. As the physical means, for example, external impact (stress) using air pressure of gas blown from a nozzle, supersonic waves, or load which uses a sphenic member and the like can be used. The multilayer body 1517 having parts of the element layer 1513 and the insulating film 1514 separated in this step constitutes a part of a semiconductor device later.

The substrate 1511 which has been separated can be reused after removing the separation layer 1512. Thus, a semiconductor device can be manufactured at lower cost. For example, even in the case of using a quartz substrate of high material cost, a semiconductor device can be manufactured at low cost by using the quartz substrate repeatedly.

Not only the method of separation by a physical means after forming the opening portions 1515 as aforementioned, but also such a method can be used that the opening portions 1515 are formed, an etchant is introduced into the opening portions 1515 to remove the separation layer 1512, and separation is carried out by a physical means. In the latter case, the separation layer 1512 may be removed wholly or may be selectively removed so as to leave a part thereof. By leaving a part of the separation layer 1512, the multilayer body 1517 can be held over the substrate 1511 even after removing the separation layer. By a process without removing the entire separation layer 1512, consumption amount of the etchant can be reduced and a process time can be shortened. Thus, cost reduction and high efficiency can be achieved. As the etchant, a liquid or a gas containing halogen or halogen fluoride such as a chloride trifluoride gas can be used. Moreover, $CF_4$, $SF_6$, $NF_3$, $F_2$, or the like can be used.

Next, a first stacking film (also called a laminating film) is formed over one surface of the multilayer body 1517 separated from the substrate 1511. The first stacking film is provided by carrying out one or both of a heat treatment and a pressurization treatment after being attached to the insulating film 1514.

Subsequently, a second stacking film is provided on the other surface of the multilayer body 1517 (a side opposite to the side where the first stacking film is provided). In this case, in order to form a thinner semiconductor device, it is preferable to provide the second stacking film newly after removing the film 1516. The second stacking film preferably has the same structure as the first stacking film.

Figure 15C:
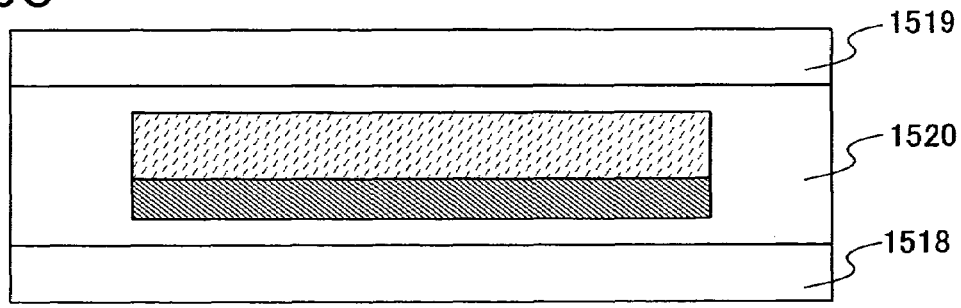

At least one surface of each of the first stacking film and the second stacking film has an adhesive layer, and the adhesive layer and the multilayer body 1517 are pasted to each other so that the adhesive layer and the multilayer body 1517 are in contact with each other. Each of the first stacking film and the second stacking film is formed by a film in which a base material (base film) and an adhesive layer are stacked. In this embodiment, the first stacking film has a first base material 1518 and a first adhesive layer, while the second stacking film has a second base material 1519 and a second adhesive layer. Then, the first adhesive layer of the first stacking film and the second adhesive layer of the second stacking film are pasted to each other to become an adhesive layer 1520 (FIG. 15C).

The base material (base film) only needs to have a higher melting point than at least the material used for the adhesive agent, and may be selected in accordance with the intended purpose. In other words, not only a single-layer film but also a multilayer film in which films having different properties are stacked appropriately may be used. As a film that can be used for the base material, specifically, the following materials are given: polyethylene, polyethylene terephthalate (PET), polyethylene naphthalate (PEN), nylon, ethylene vinyl alcohol copolymer film (EVOH), polypropylene, polystyrene, an AS resin, an ABS resin (a resin in which acrylonitrile, butadiene, and styrene are polymerized), a methacryl resin (also called acrylic), polyvinyl chloride, polyacetal, polyamide, polycarbonate, modified polyphenylene ether, polybutylene terephthalate (PBT), polysulfone, polyether sulfone (PES), polyphenylene sulfide, polyamide-imide, polymethylpentene, a phenolic resin, a urea resin, a melamine resin, an epoxy resin, a diallyl phthalate resin, an unsaturated polyester resin, polyimide, or polyurethane, or a fibrous material (for example, paper), a film to which antistatic countermeasure has been implemented (antistatic film), and the like.

As the antistatic film, a film in which an antistatic material is diffused in a resin, a film to which an antistatic material is pasted, or the like can be used. As the film to which an antistatic material is pasted, a film in which an antistatic material is pasted to one surface of a film which becomes the base material, or a film to which antistatic materials are pasted to opposite surfaces thereof can be used. Moreover, a film to which an antistatic material is pasted on one surface may be provided so that the surface on which the antistatic material is pasted comes to the outside of the film though it preferably comes to the inside thereof. Moreover, the antistatic material may be pasted to the whole or a part of the surface of the film. As the antistatic material, a metal such as aluminum, an oxide containing indium and tin (ITO), metal salt of amphoteric surfactant, imidazolin type amphoteric surfactant, a resin material containing a cross-linking copolymer high molecular compound having a carboxyl group and a quaternary ammonium base on a side chain, or the like can be given. By using the antistatic film as the first base material 1518 and the second base material 1519, the integrated circuits can be prevented from being adversely affected by static electricity from the outside.

The material for the adhesive agent only needs to have a lower melting point than at least the material used for the base material. For example, a material containing, as its main component, a thermoplastic resin such as a polyethylene-based resin, a polyester-based resin, or ethylene vinyl acetate (EVA); a thermosetting resin; an ultraviolet curable resin; or the like can be used. The first stacking film and the second stacking film which have the adhesive layers are subjected to a heat treatment and a pressure treatment so that they are attached to each other. When the heat treatment and the pressure treatment are carried out on the first stacking film and the second stacking film, the adhesive layers provided at uppermost surfaces of the stacking films or layers provided at outermost layers of the stacking films (not the adhesive layer) are melted by the heat treatment and then the layers are attached by applying pressure thereto.

In order to further prevent intrusion of moisture to the inside of the semiconductor device (the multilayer body 1517) formed in the end, it is preferable to apply powder of silicon dioxide (silica) between the base material and the adhesive layer. By applying the powder, the moisture-prevention property can be increased further even under an environment of high temperature and high humidity. With a similar purpose, i.e., in order to further prevent moisture and the like from entering the semiconductor device (multilayer body 1517) formed in the end, a multilayer film formed by a film containing silicon oxide, silicon nitride, silicon nitride containing oxygen, silicon oxide containing nitrogen, or ceramic (such as aluminum oxide) as its main component may be formed between the base material and the adhesive layer by a CVD method, a sputtering method, an evaporation method, or the like. Moreover, in order to increase the physical strength of the semiconductor device (multilayer body 1517) formed in the end, a surface of the base material (on the side exposing to the outside) which is opposite to a surface of the base material where the adhesive layer is formed may be coated with a material containing carbon as its main component (such as diamond-like carbon) by a CVD method, a sputtering method, an evaporation method, or the like. Alternatively, a mixture of powder of silicon dioxide (silica), a silicon nitride film containing oxygen, a silicon oxide film containing nitrogen, and a material containing carbon as its main component may be applied. These treatments may be carried out on one or both of the first stacking film and the second stacking film.

Next, the first stacking film and the second stacking film are cut by a cutting means. The cutting means corresponds to a dicer, a laser, a wire saw, or the like. If a laser is used as the cutting means, a sealed structure can be obtained at the same time as cutting the first base material 1518 and the second base material 1519 by appropriately setting a laser condition.

By applying the present invention in this way, the productivity of the semiconductor devices can be improved and cost reduction of the semiconductor devices can be achieved. The semiconductor device manufactured in this embodiment is generally formed by being separated from a substrate which is normally nonflexible because of having a certain thickness. Thus, the semiconductor device having flexibility can be obtained and this semiconductor device can be provided to various places including a curved portion of a product.

This embodiment can be appropriately combined with any of the embodiment modes and embodiments.

Embodiment 5

This embodiment will describe a method for manufacturing a semiconductor device, which is different from that described in Embodiment 4.

First, the layer 1513 provided with a plurality of integrated circuits including thin film transistors as elements (hereinafter referred to as "element layer 1513") is formed over one surface of the substrate 1511. In this specification, the expression "one surface of the substrate 1511" refers to a surface on a side provided with the element layer 1513. The materials, formation methods, and the like explained in Embodiment 4 can be used for the substrate 1511 and the element layer 1513. In this embodiment, a semiconductor film is crystallized using a fiber laser by the method explained in the above embodiment mode to form a thin film transistor.

When contamination of the element layer 1513 by impurities or the like from the substrate 1511 is a concern, a base film is preferably formed between the substrate 1511 and the element layer 1513. The base film explained in Embodiment 4 can be used.

In addition, as a protective layer for ensuring strength of the element layer 1513, an insulating film may be formed in advance to cover the element layer 1513. This insulating film is preferably provided entirely so as to cover the element layer 1513; however, the insulating film is not always required to be provided entirely and may be provided selectively. As a material for the insulating film, a film containing carbon such as DLC (diamond-like carbon), a silicon oxide film containing nitrogen, a silicon nitride film containing oxygen, or a film formed with an organic material (for example, a resin material such as epoxy) can be used. As a method for forming the insulating film, a sputtering method, various kinds of CVD methods such as a plasma CVD method, a spin coating method, a droplet discharging method, a printing method, or the like can be used.

Figure 16A:
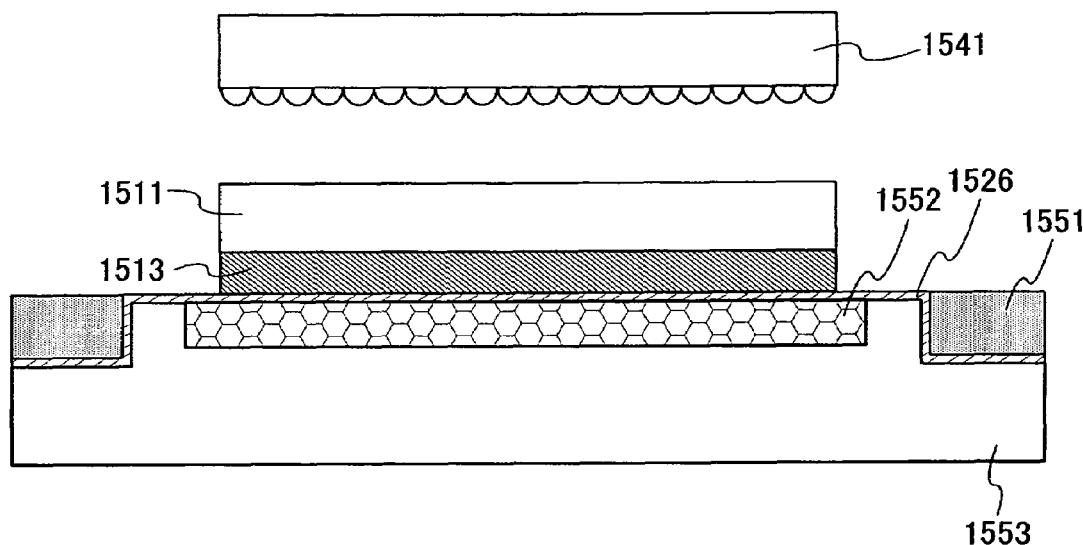
FIGS. 16A to 16C show a method for manufacturing a semiconductor device of the present invention (Embodiment 5)

Subsequently, a film 1526 is pasted onto the element layer 1513. Then, the film 1526 is placed on a suction jig by using a substrate fixing jig (frame) 1551 (FIG. 16A). The suction jig includes, for example, a porous chuck 1552 and a stage 1553. The porous chuck 1552 is formed of a porous substance and has a vacuum chuck mechanism. Further, in order to prevent the substrate fixing jig itself from being ground or polished, the film 1526 is placed so that one surface of the substrate 1511 (a surface on a side provided with the film 1526) is in a higher position than one surface of the substrate fixing jig 1551.

The film 1526 functions to fix the substrate when the substrate is ground or polished later, to protect the element layer 1513, or to ensure a space between semiconductor devices when the semiconductor devices are separated from the film 1526. As the film functioning as described above, an expand film may be used. Alternatively, a film in which a film protecting the element layer 1513 and an expand film are stacked may be used. The film 1516 preferably has such a property that adhesion is high in a normal state but becomes lower by light irradiation. For example, a UV tape of which adhesion gets lower by ultraviolet light irradiation may be used.

Next, the other surface of the substrate 1511 is ground by a grinding means 1541. At this time, the substrate 1511 is ground to be 100 μm or less in thickness. Generally, in this grinding step, one or both of the stage 1553 to which the substrate 1511 is fixed and the grinding means 1541 is/are rotated to grind the other surface of the substrate 1511. The grinding means 1541 corresponds to, for example, a grinding stone. In this specification, the expression "the other surface of the substrate 1511" refers to a surface opposite to the surface on the side provided with the element layer 1513, and the surface which is ground by the grinding means 1541. Note that cleaning may be performed if necessary in order to remove dust generated in the grinding step. In this case, a water droplet generated by cleaning is dried naturally or dried by using a drying means. As the drying means, specifically, a method of rotating the substrate 1511, a method of blowing air (atmosphere) or a gas such as a rare gas to the substrate 1511 by using a blower, or the like can be used.

Figure 16B:
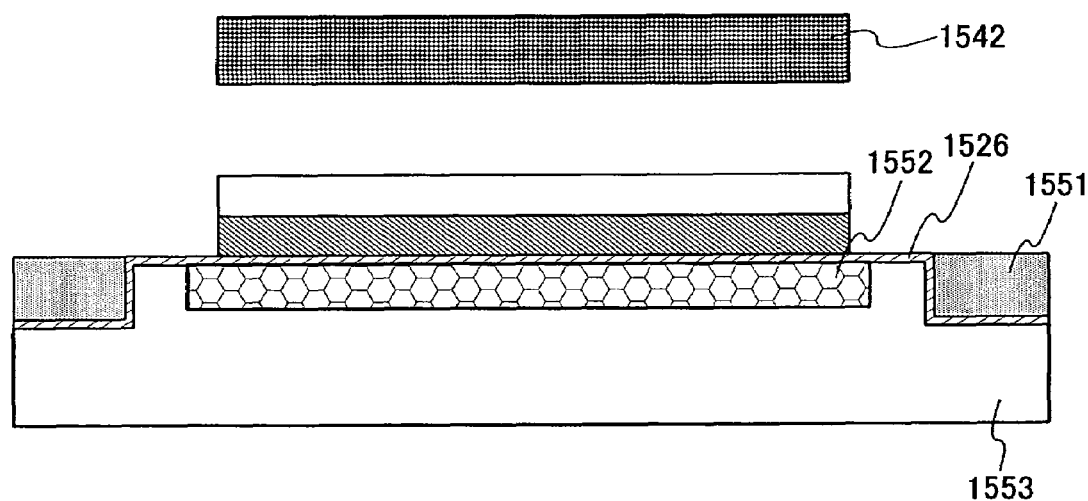

Next, the other surface of the substrate 1511, which has been ground, is polished by a polishing means 1542 (FIG. 16B). The substrate 1511 may be polished to be less than 100 μm in thickness, and preferably, 2 μm to 50 μm (more preferably, 4 μm to 30 μm). By grinding and polishing the substrate 1511 as described above, the substrate 1511 becomes flexible and a flexible semiconductor device can be manufactured without using a method for separating the element layer from the substrate 1511. Also in this polishing step, similarly to the above grinding step, one or both of the stage 1553 to which the substrate 1511 is fixed and the polishing means 1542 is/are rotated to polish the other surface of the substrate 1511. The polishing means 1542 corresponds to, for example, a polishing pad coated with polishing abrasive grains (such as cerium oxide). Note that cleaning may be performed if necessary in order to remove particles generated in the polishing step. In this case, a water droplet generated by cleaning is dried naturally or dried by using a drying means. As the drying means, specifically, a method for rotating the substrate 1511, a method for blowing air (atmosphere) or a gas such as a noble gas to the substrate 1511 by using a blower, or the like can be used.

Figure 16C:
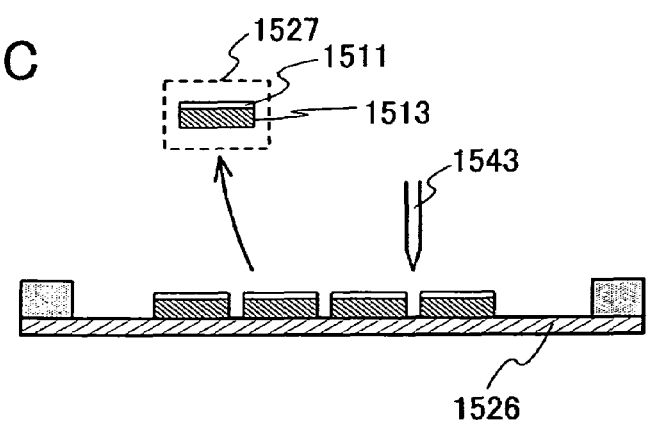

Subsequently, the film 1526 is removed from the suction jig. Then, the substrate 1511 and the element layer 1513 are cut by a cutting means 1543 so as not to cut the film 1526 (FIG. 16C). At this time, the plurality of integrated circuits are cut at their boundaries (between the integrated circuits) so that the plurality of integrated circuits included in the element layer 1513 are separated from each other. In addition, the insulating film included in the element layer 1513 is cut so as not to cut the elements provided in the element layer 1513. Through this cutting step, a plurality of multilayer bodies 1527 each including the thinned substrate 1511 and the element layer 1513 provided with the integrated circuit are formed. Note that the cutting means corresponds to, for example, a dicer, a laser, or a wire saw.

Figure 17A:
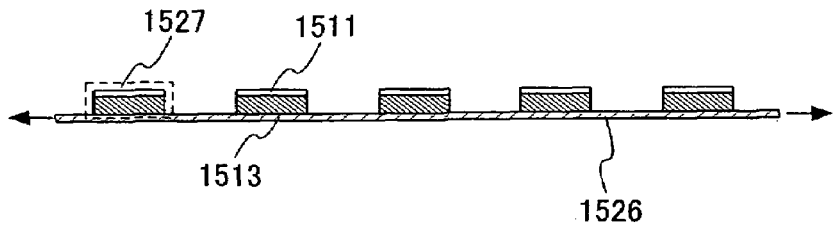
FIGS. 17A to 17D show a method for manufacturing a semiconductor device of the present invention (Embodiment 5)

Then, the film 1526 is stretched so that spaces are formed between the multilayer bodies 1527 (FIG. 17A). Herein, it is preferable to extend the film 1526 evenly in a plane direction (to pull equally in a plane direction) so as to make the spaces between the multilayer bodies 1527 uniform. Then, the film 1526 is irradiated with light. In the case where the film 1526 is a UV tape, the film 1526 is irradiated with ultraviolet light. By the light irradiation, adhesion of the film 1526 is lowered, and thus, adhesion between the film 1526 and the multilayer bodies 1527 is lowered, which leads to a state where the multilayer bodies 1527 can be separated from the film 1526 by a physical means.

Note that in the above steps, the step of irradiating the film 1526 with light is carried out after the step of stretching the film 1526; however, the present invention is not limited to this order. The step of stretching the film 1526 may be carried out after the step of irradiating the film 1526 with light.

Next, a sealing treatment is performed on the multilayer bodies 1527. As the sealing treatment, there are two methods. First, a first method is explained.

Figure 17B:
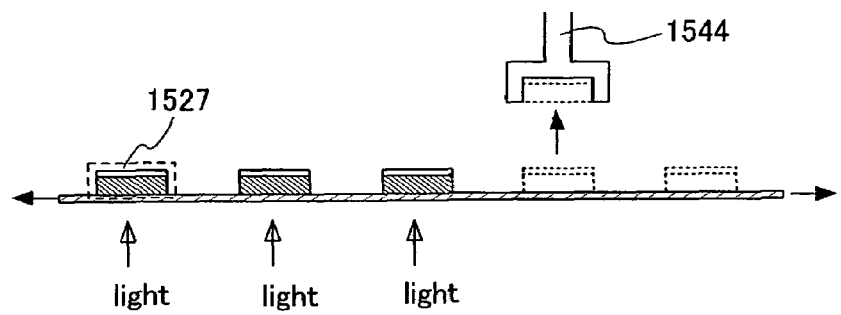

In the first method, the multilayer body 1527 is separated from the film 1526 by a transfer means 1544 (FIG. 17B). Then, the multilayer body 1527 is placed over a first stacking film 1561 by the transfer means 1544 so that one surface of the multilayer body 1527 is attached to the first stacking film 1561. Note that the transfer means 1544 is specifically a contact transfer means such as lifting up using a pin, picking up using an arm, or vacuum suction using a vacuum mechanism, a non-contact transfer means using a magnetic force, air pressure, or an electrostatic force as suction power or levitation force, or the like.

Figure 17C:
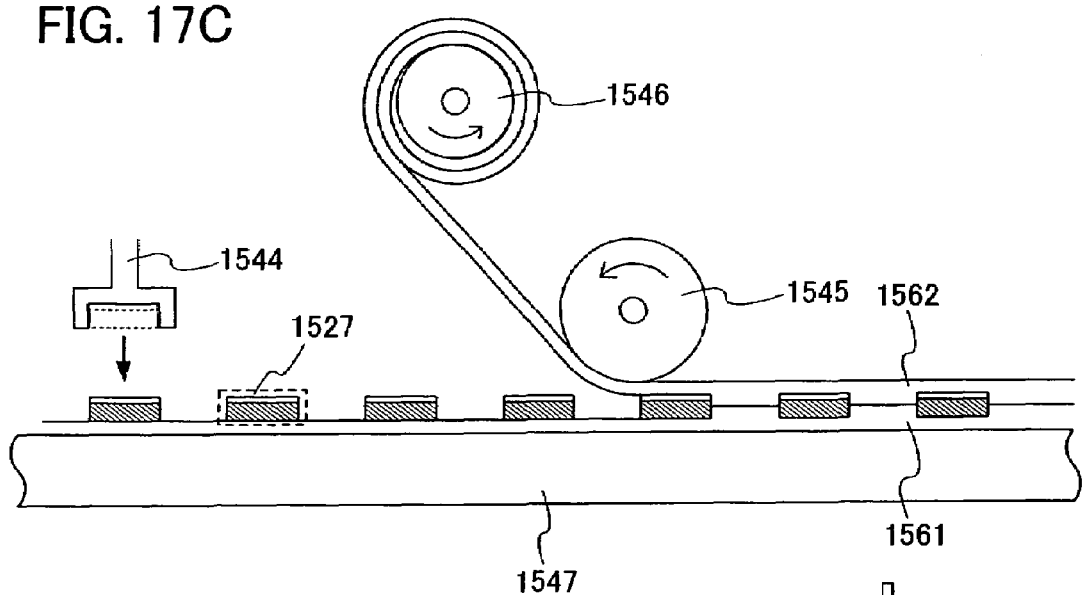

Subsequently, the other surface of the multilayer body 1527 is attached to a second stacking film 1562 (FIG. 17C). This step is carried out using an adhesion apparatus (hereinafter referred to as a laminating apparatus). The laminating apparatus includes a first roller 1545 and a second roller 1546. The first roller 1545 has one or both of a heating means and a pressure means. The second roller 1546 has the second stacking film 1562 winding therearound and supplies the second stacking film 1562 to the first roller 1545.

The first stacking film 1561 over which the plurality of multilayer bodies 1527 are provided is sequentially transported by a transport means 1547. In addition, the first roller 1545 and the second roller 1546 are each sequentially rotated to continuously perform the sealing treatment of the multilayer bodies 1527. In the sealing treatment described here, when the first stacking film 1561 to which the multilayer bodies 1527 are attached passes between the first roller 1545 and the transport means 1547, one or both of the pressure treatment and the heat treatment is/are performed, so that the first stacking film 1561 and the second stacking film 1562 are attached to the multilayer bodies 1527. In the case where the heat treatment is performed by the first roller 1545 and the transport means 1547, the first roller 1545 includes a heating means corresponding to a heater with a heating wire, oil, or the like. In addition, when both of the heat treatment and the pressure treatment are performed, an adhesive layer provided as the uppermost layer of the stacking film is melted by the heat treatment and attached by the pressure treatment. The transport means 1547 corresponds to a belt conveyer, a plurality of rollers, or a robot arm.

The first stacking film 1561 used for the sealing includes a first base material and a first adhesive layer, and the second stacking film 1562 includes a second base material and a second adhesive layer. As the base materials and the adhesive layers, the materials explained in Embodiment Mode 1 can be appropriately employed. In addition, the first stacking film 1561 and the second stacking film 1562 are attached to the multilayer bodies 1527 by a heat treatment and a pressure treatment.

Figure 17D:
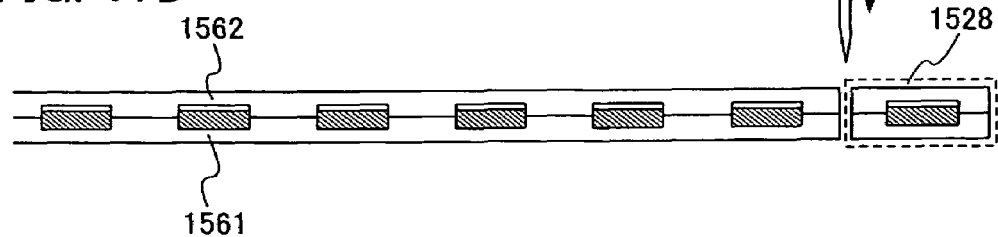

Then, the first stacking film 1561 and the second stacking film 1562 are cut by a cutting means 1548 (FIG. 17D). The cutting means 1548 corresponds to a dicer, a laser, a wire saw, or the like. In the case of using a laser as the cutting means, sealing can be performed at the same time as cutting the first base material 1518 and the second base material 1519 by appropriately setting a laser condition.

Next, a second method is explained.

Figure 18A:
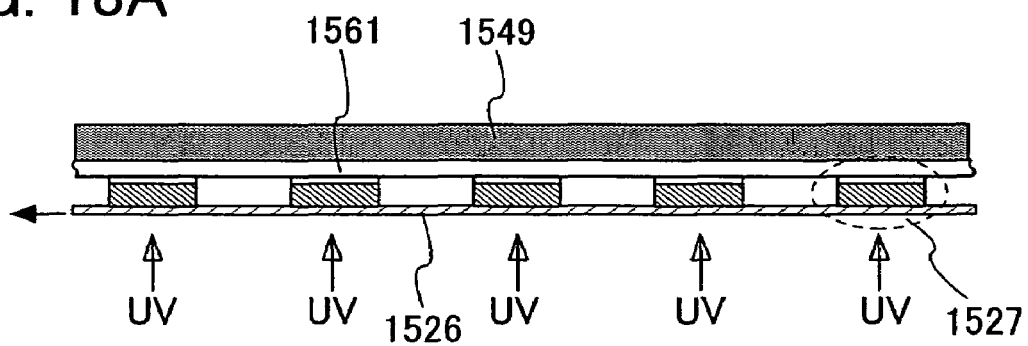
FIGS. 18A and 18B show a method for manufacturing a semiconductor device of the present invention (Embodiment 5)
Figure 18B:
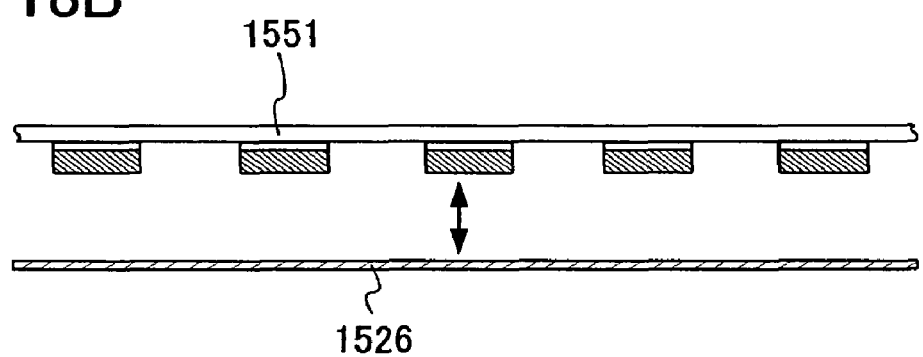

First, the film 1526 is irradiated with light in order to lower adhesion between the film 1526 and the multilayer body 1527. Then, the first stacking film 1561 is provided so as to cover one surface of the multilayer body 1527 (FIG. 18A). Subsequently, the first stacking film 1561 is heated by a heating means 1549, and one surface of the multilayer body 1527 is attached to the first stacking film 1561. Subsequently, the multilayer body 1527 is separated from the film 1526 (FIG. 18B).

Note that in the second method, the first stacking film 1561 is provided so as to cover one surface of the multilayer body 1527 after irradiating the film 1526 with light. However, the present invention is not limited to this order. For example, the first stacking film 1561 may be provided so as to cover one surface of the multilayer body 1527, and the film 1526 may be irradiated with light after heating the first stacking film 1561.

Then, the other surface of the multilayer body 1527 is attached to the second stacking film 1562. Subsequently, the first stacking film 1561 and the second stacking film 1562 are cut. A cutting means corresponds to a dicer, a laser, a wire saw, or the like. In the case of using a laser as the cutting means, a structure in which sealing is performed at the same time as cutting the first base material 1518 and the second base material 1519 can be obtained by appropriately setting a laser condition.

Since the substrate included in the semiconductor device completed through the above steps is thin, even a substrate that is normally nonflexible such as a glass substrate has flexibility. Therefore, the semiconductor device can be provided at various places such as a curved portion of a product. In addition, since the substrate is thin, a thickness of the semiconductor device as a whole is thinner, and attractive design of a product is not damaged even when the semiconductor device is mounted on the product.

This embodiment can be appropriately combined with any of the above embodiment modes and embodiments.

Embodiment 6

Figure 19:
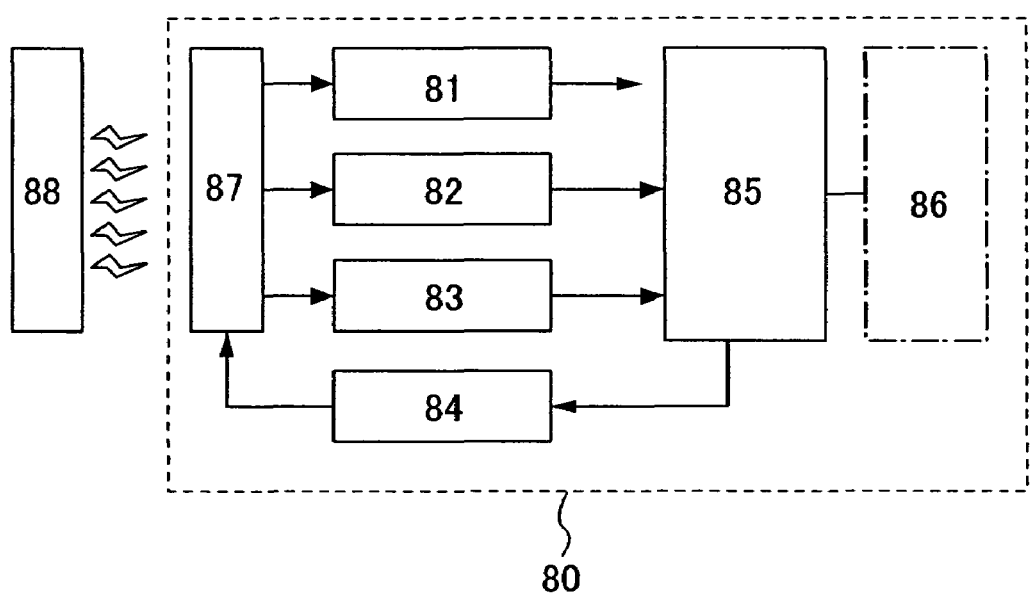
FIG. 19 shows a semiconductor device of the present invention (Embodiment 6)

This embodiment will describe one mode in the case of utilizing the semiconductor device of the present invention as an RFID tag that can send and receive data without contact, with reference to FIG. 19.

A semiconductor device 80 has a function of exchanging data without contact, and includes a power supply circuit 81, a clock generation circuit 82, a data demodulation circuit 83, a data modulation circuit 84, a control circuit 85 which controls another circuit, a storage circuit 86, and an antenna 87 (FIG. 19). Note that the number of storage circuits is not limited to one, and may be plural. An SRAM, a flash memory, a ROM, an FeRAM, a memory using an organic compound layer for a storage element portion, or the like can be used.

A signal which is sent from a reader/writer 88 as an electric wave is converted into an AC electrical signal at the antenna 87 by, for example, electromagnetic induction. The power supply circuit 81 generates a power supply voltage using the AC electrical signal and supplies the power supply voltage to each circuit through power supply wiring. The clock generation circuit 82 generates various kinds of clock signals based on the AC signal inputted from the antenna 87, and supplies the clock signals to the control circuit 85. The demodulation circuit 83 demodulates the AC electrical signal and supplies it to the control circuit 85. The control circuit 85 performs various kinds of arithmetic processing in accordance with the inputted signal. The storage circuit 86 stores a program, data, or the like used in the control circuit 85, and can also be used as an operation area at the time of arithmetic processing. Then, data is sent from the control circuit 85 to the modulation circuit 84, and load modulation can be applied from the modulation circuit 84 to the antenna 87 in accordance with the data. The reader/writer 88 can read data as a result of receiving the load modulation applied to the antenna 87 as an electric wave.

Next, the shape of the antenna 87 is explained. As a signal transmission method in the semiconductor device 80 (RFID tag 80), an electromagnetic coupling method, an electromagnetic induction method, or a microwave method can be used. The transmission method may be appropriately selected by a practitioner in consideration of an intended purpose, and an optimum antenna may be provided in accordance with the transmission method.

For example, in the case of employing an electromagnetic coupling method or an electromagnetic induction method (for example, a 13.56 MHz band) as the signal transmission method in the semiconductor device 80, electromagnetic induction caused by a change in magnetic field density is utilized. Therefore, a conductive film serving as the antenna is formed in an annular shape (for example, a loop antenna) or a spiral shape.

In the case of employing a microwave method (for example, a UHF band (860 to 960 MHz band), a 2.45 GHz band, or the like) as the signal transmission method in the semiconductor device 80, the length and shape of the antenna may be appropriately set in consideration of a wavelength of an electromagnetic wave used for signal transmission. For example, the antenna 87 may be formed in a linear shape (for example, a dipole antenna) or a flat shape (for example, a patch antenna). The shape of the antenna 87 is not limited to a linear shape, and the antenna may be formed in a curved shape, a meander shape, or a combination thereof, in consideration of a wavelength of an electromagnetic wave.

Next, a formation method and a material of the antenna 87 are explained. As the formation method of the antenna 87, a CVD method, a sputtering method, a printing method such as screen printing or gravure printing, a droplet discharging method, a dispenser method, a plating method, or the like can be used. As the material of the antenna 87, an element selected from aluminum (Al), titanium (Ti), silver (Ag), copper (Cu), gold (Au), platinum (Pt), nickel (Ni), palladium (Pd), tantalum (Ta), and molybdenum (Mo) or an alloy or compound material containing the element as its main component can be used. Alternatively, fine particles containing solder (preferably, lead-free solder) as its main component may be used; in this case, it is preferable to use a fine particle having a grain diameter of 20 μm or less. Solder has an advantage of low cost. Further, ceramic, ferrite, or the like can be applied to the antenna.

In the case of forming the antenna 87 by using, for example, a screen printing method, the antenna can be provided by selectively printing conductive paste in which conductive particles each having a grain diameter of several nm to several tens of μm are dissolved or dispersed in an organic resin. As the conductive particle, a fine particle or a dispersive nanoparticle of one or more kinds of metals selected from silver (Ag), gold (Au), copper (Cu), nickel (Ni), platinum (Pt), palladium (Pd), tantalum (Ta), molybdenum (Mo), and titanium (Ti) or silver halide can be used. In addition, as the organic resin included in the conductive paste, one or more organic resins each functioning as a binder, a solvent, a dispersant, or a coating of the metal particle can be used. Typically, an organic resin such as an epoxy resin or a silicon resin can be used. When forming the antenna 87, baking is preferably performed after the conductive paste is squeezed. For example, in the case of using fine particles (each of which has a grain diameter of 1 nm to 100 nm) containing silver as its main component, as a material of the conductive paste, the antenna 87 can be formed by curing the conductive paste by baking at a temperature of 150 to 300° C.

In the case of employing an electromagnetic coupling method or an electromagnetic induction method, and providing the semiconductor device 80 in contact with metal, a magnetic material having magnetic permeability is preferably provided between the semiconductor device and the metal. In the case of providing a semiconductor device including an antenna in contact with metal, an eddy current flows to the metal in accordance with a change in magnetic field, and the eddy current impairs a change in magnetic field and decreases a communication distance. Therefore, the eddy current of the metal and the decrease in communication distance can be suppressed by providing a material having high magnetic permeability between the semiconductor device and the metal. Note that ferrite or a metal thin film having high magnetic permeability and little loss of high frequency wave can be used as the magnetic material.

In addition, the semiconductor device 80 may supply a power supply voltage to each circuit by an electric wave without a power source (battery) mounted, or by an electric wave and a power source (battery) with the power source (battery) mounted.

This embodiment can be appropriately combined with any of the above embodiment modes and embodiments.

Embodiment 7

This embodiment will explain examples of applying TFTs manufactured using a fiber laser to various electronic appliances. Examples of the electronic appliances can be given as follows: a camera such as a video camera or a digital camera, a navigation system, a sound reproducing device (a car audio, an audio component, or the like), a computer, a game machine, a portable information terminal (a mobile computer, a mobile phone, a mobile game machine, an electronic book, or the like), an image reproducing device including a recording medium (specifically, a device for reproducing a recording medium such as a digital versatile disc (DVD) and having a display for displaying the reproduced image), and the like.

An electronic appliance can be manufactured at low cost by using the present invention. Specific examples of electronic appliances are explained with reference to FIGS. 20A to 20E.

Figure 20A:
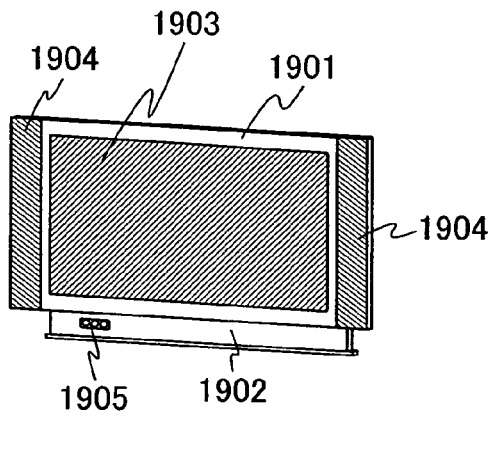
FIGS. 20A to 20E show electronic appliances each using a semiconductor device manufactured in accordance with the present invention (Embodiment 7)

FIG. 20A shows a display device, which includes a housing 1901, a support 1902, a display portion 1903, a speaker portion 1904, a video input terminal 1905, and the like. This display device is manufactured using a thin film transistor formed by the manufacturing method described in another embodiment mode or embodiment for the display portion 1903 and a driver circuit. Note that the display device includes, in its category, a liquid crystal display device, a light-emitting device, and the like, and specifically, all display devices used for displaying information, for example, for a computer, for TV broadcast reception, or for advertisement display.

Figure 20B:
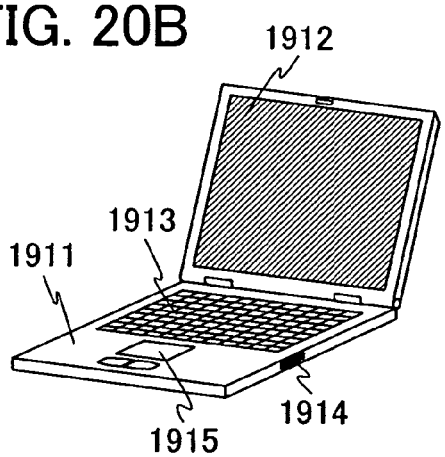

FIG. 20B shows a computer, which includes a housing 1911, a display portion 1912, a keyboard 1913, an external connection port 1914, a pointing mouse 1915, and the like. This computer is manufactured using a thin film transistor formed by the manufacturing method described in another embodiment mode or embodiment for the display portion 1912 and other circuits. In addition, the present invention can be applied to a semiconductor device such as a CPU or a memory in the computer.

Figure 20C:
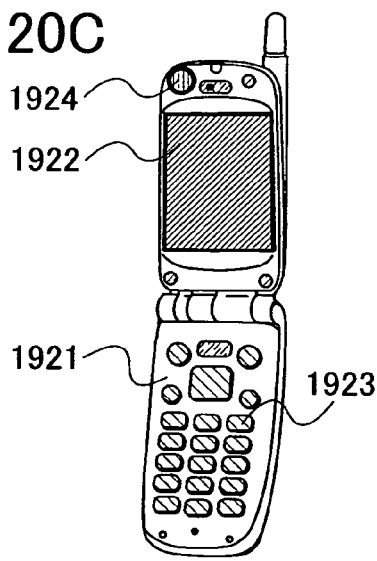

FIG. 20C shows a mobile phone, which is a typical example of a portable information terminal. This mobile phone includes a housing 1921, a display portion 1922, a sensor portion 1924, an operation key 1923, and the like. The sensor portion 1924 includes an optical sensor element, and current consumption of the mobile phone can be suppressed by controlling a luminance of the display portion 1922 in accordance with illuminance obtained at the sensor portion 1924 or controlling lighting of the operation key 1923 in accordance with the illuminance obtained at the sensor portion 1924. In addition, in the case of a mobile phone having an imaging function such as a CCD or the like, whether or not a person who takes a picture looks into an optical finder is detected based on the change in the amount of light received by a sensor of the sensor portion 1924 provided in the vicinity of the optical finder. In the case where a person who takes a picture looks into the optical finder, power consumption can be suppressed by turning off the display portion 1922.

An electronic device such as a PDA (Personal Digital Assistant), a digital camera, or a compact game machine as well as the above mobile phone is a portable information terminal, which has a feature of a small display screen.

A thin film transistor manufactured using the laser irradiation apparatus of the present invention can also be used as an RFID tag (also referred to as a non-contact thin film integrated circuit, a wireless IC tag, or a radio frequency identification tag). By attaching RFID tags to various electronic appliances, distribution routes and the like of the electronic devices can be revealed.

Figure 20D:
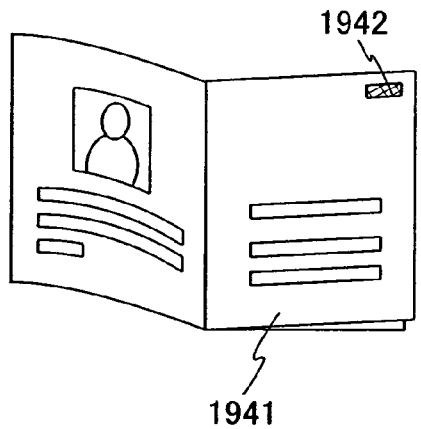

FIG. 20D shows a passport 1941 to which an RFID tag 1942 is fixed. Note that the RFID tag 1942 may be embedded in the passport 1941. The RFID tag can be similarly fixed to or embedded in a driver's license, a credit card, paper money, a coin, securities, a gift coupon, a ticket, a traveler's check (T/C), a health insurance, a resident's card, a family register, or the like. In this case, only the information showing that this is an authentic one is inputted to the RFID tag and an access right is set to prevent unauthorized reading or writing of information. That can be realized by using the memory described in another embodiment. By using the semiconductor device as a tag in this manner, it is possible to distinguish a forged one from the authentic one.

Figure 20E:
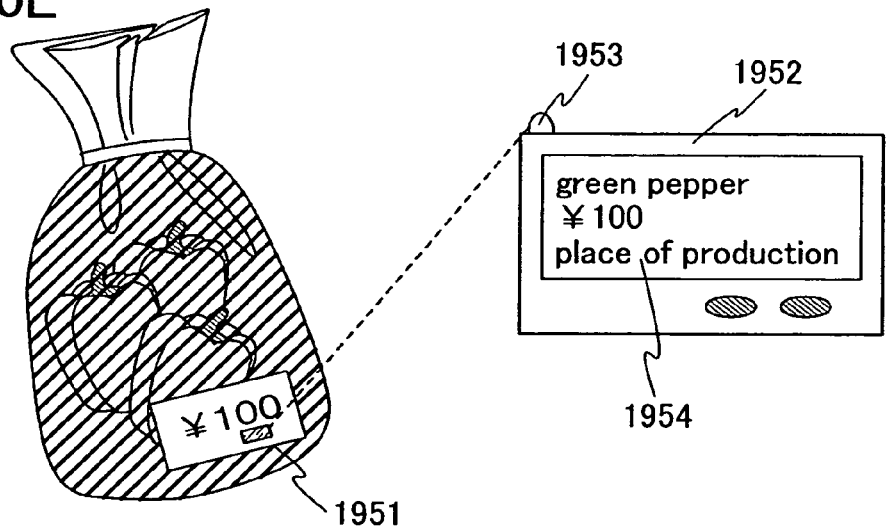

In addition, the RFID tag can also be used as a memory. FIG. 20E shows an example in the case of using an RFID tag 1951 for a label attached to a vegetable wrapping. The RFID tag may be attached to or embedded in the wrapping itself. The RFID tag 1951 can store various kinds of identification information such as a place of production, a producer, a date of manufacturing, a process at a production stage like a processing method, a process of product distribution, a price, numerical quantity, a purpose, a shape, weight, an expire date, and the like. The information from the RFID tag 1951 is received and read by an antenna portion 1953 of a wireless reader 1952, and displayed in a display portion 1954 of the reader 1952. Thus, the information can be easily known to dealers, retailers, and consumers. The system is that access rights of a producer, a trader, and a consumer are respectively set, and reading, writing, rewriting, and erasing cannot be conducted without the access right.

Further, the RFID tag can be used as below. In stores, the information that a payment has been made is written in the RFID tag, and whether the payment has been made or not is checked by a checking means provided at an exit. If people leave the stores without payments, an alarm rings. This method can prevent forgetting about paying and shoplifting.

In considering the protection of customer privacy, any of the following methods are preferably carried out when the payment is made at the cash register: (1) the data inputted in the RFID tag is locked with a personal identification number or the like; (2) the data itself inputted in the RFID tag is encrypted; (3) the data inputted in the RFID tag is erased; and (4) the data inputted in the RFID tag is destroyed. These methods can be realized by using the memory described in another embodiment. A checking means is provided at an exit, and whether any of the processes (1) to (4) is conducted or no processing of the data in the RFID tag is conducted is checked, thereby checking whether or not payment has been made. In this manner, it is possible to check whether or not payment has been made in stores, and the information in the RFID tag can be prevented from being read against the owner's will outside the stores.

As for the above-described RFID tag, manufacturing cost is higher than that of a barcode which has been used, so cost needs to be reduced. Since cost at a heating process of a semiconductor film can be reduced by using the present invention, cost of an RFID tag including the semiconductor film can also be reduced.

As described above, an applicable range of the semiconductor device manufactured according to the present invention is so wide that the semiconductor device manufactured according to the present invention can be used for electronic appliances of various fields.

This embodiment can be appropriately combined with any of the above embodiment modes and embodiments.

This application is based on Japanese Patent Application serial no. 2005-255637 filed in Japan Patent Office on Sep. 2, 2005, the contents of which are hereby incorporated by reference.

What is claimed is:

1. A method for manufacturing a semiconductor device, comprising:
    oscillating a laser beam in an optical fiber of a fiber laser, wherein the optical fiber includes a laser medium; and
    irradiating a semiconductor film with the laser beam emitted from the fiber laser so as to crystallize or activate the semiconductor film.

2. A method for manufacturing a semiconductor device, comprising:
    oscillating a first laser beam in a first optical fiber of a first fiber laser, wherein the first optical fiber includes a first laser medium;
    oscillating a second laser beam in a second optical fiber of a second fiber laser, wherein the second optical fiber includes a second laser medium;
    coupling the first laser beam and the second laser beam emitted from the first fiber laser and the second fiber laser into a third laser beam; and
    irradiating a semiconductor film with the third laser beam so as to crystallize or activate the semiconductor film.

3. A method for manufacturing a semiconductor device, comprising:
    oscillating a laser beam in an optical fiber of a fiber laser, wherein the optical fiber includes a laser medium;
    dividing the laser beam emitted from the fiber laser into a plurality of laser beams; and
    irradiating a semiconductor film with the plurality of laser beams so as to crystallize or activate the semiconductor film.

4. A method for manufacturing a semiconductor device, comprising:
    arranging a first exit of a first fiber laser and a second exit of a second fiber laser;
    oscillating a first laser beam in a first optical fiber of the first fiber laser, wherein the first optical fiber includes a first laser medium;
    oscillating a second laser beam in a second optical fiber of the second fiber laser, wherein the second optical fiber includes a second laser medium; and
    irradiating a semiconductor film with the first laser beam and the second laser beam emitted from the first exit and the second exit so as to crystallize or activate the semiconductor film.

5. A method for manufacturing a semiconductor device, comprising:
    oscillating a first laser beam in a first optical fiber of a first fiber laser, wherein the first optical fiber includes a first laser medium;
    oscillating a second laser beam in a second optical fiber of a second fiber laser, wherein the second optical fiber includes a second laser medium;
    shaping the first laser beam and the second laser beam emitted from the first fiber laser and the second fiber laser into one linear beam through an optical system; and
    irradiating a semiconductor film with the linear beam so as to crystallize or activate the semiconductor film.

6. A method for manufacturing a semiconductor device, comprising:
    oscillating a first laser beam in a first optical fiber of a first fiber laser, wherein the first optical fiber includes a first laser medium;

oscillating a second laser beam in a second optical fiber of a second fiber laser, wherein the second optical fiber includes a second laser medium;

shaping the first laser beam and the second laser beam emitted from the first fiber laser and the second fiber laser into a first linear beam and a second linear beam through an optical system; and irradiating a semiconductor film with the first linear beam and the second linear beam so as to crystallize or activate the semiconductor film.

7. The method for manufacturing a semiconductor device according to claim 1,
wherein the semiconductor film is an amorphous semiconductor film.

8. The method for manufacturing a semiconductor device according to claim 2,
wherein the semiconductor film is an amorphous semiconductor film.

9. The method for manufacturing a semiconductor device according to claim 3,
wherein the semiconductor film is an amorphous semiconductor film.

10. The method for manufacturing a semiconductor device according to claim 4,
wherein the semiconductor film is an amorphous semiconductor film.

11. The method for manufacturing a semiconductor device according to claim 5,
wherein the semiconductor film is an amorphous semiconductor film.

12. The method for manufacturing a semiconductor device according to claim 6,
wherein the semiconductor film is an amorphous semiconductor film.

13. A method for manufacturing a semiconductor device, comprising:

forming a base film over a glass substrate;

forming an amorphous silicon film over the base film;

oscillating a laser beam in an optical fiber of a fiber laser, wherein the optical fiber includes a laser medium;

irradiating the amorphous silicon film with the laser beam emitted from the fiber laser to crystallize the amorphous silicon film;

forming a gate insulating film over the crystallized silicon film;

forming a gate electrode over the gate insulating film; and forming an impurity region by adding an impurity to the crystallized silicon film using the gate electrode as a mask.

14. The method for manufacturing a semiconductor device according to claim 13 further comprising irradiating the impurity region with the laser beam.

15. The method for manufacturing a semiconductor device according to claim 1, wherein the fiber laser is a continuous wave laser.

16. The method for manufacturing a semiconductor device according to claim 2, wherein the first fiber laser and the second fiber laser are continuous wave lasers.

17. The method for manufacturing a semiconductor device according to claim 3, wherein the fiber laser is a continuous wave laser.

18. The method for manufacturing a semiconductor device according to claim 4, wherein the first fiber laser and the second fiber laser are continuous wave lasers.

19. The method for manufacturing a semiconductor device according to claim 5, wherein the first fiber laser and the second fiber laser are continuous wave lasers.

20. The method for manufacturing a semiconductor device according to claim 6, wherein the first fiber laser and the second fiber laser are continuous wave lasers.

21. The method for manufacturing a semiconductor device according to claim 13, wherein the fiber laser is a continuous wave laser.

22. The method for manufacturing a semiconductor device according to claim 1, wherein the fiber laser has a non-linear optical element for converting a laser beam of a fundamental wave into a second harmonic.

23. The method for manufacturing a semiconductor device according to claim 2, wherein the first fiber laser and the second fiber laser each have a non-linear optical element for converting a laser beam of a fundamental wave into a second harmonic.

24. The method for manufacturing a semiconductor device according to claim 3, wherein the fiber laser has a non-linear optical element for converting a laser beam of a fundamental wave into a second harmonic.

25. The method for manufacturing a semiconductor device according to claim 4, wherein the first fiber laser and the second fiber laser each have a non-linear optical element for converting a laser beam of a fundamental wave into a second harmonic.

26. The method for manufacturing a semiconductor device according to claim 5, wherein the first fiber laser and the second fiber laser each have a non-linear optical element for converting a laser beam of a fundamental wave into a second harmonic.

27. The method for manufacturing a semiconductor device according to claim 6, wherein the first fiber laser and the second fiber laser each have a non-linear optical element for converting a laser beam of a fundamental wave into a second harmonic.

28. The method for manufacturing a semiconductor device according to claim 13, wherein the fiber laser has a non-linear optical element for converting a laser beam of a fundamental wave into a second harmonic.

29. The method for manufacturing a semiconductor device according to claim 1, wherein the laser medium is a rare earth metal.

30. The method for manufacturing a semiconductor device according to claim 2, wherein the first laser medium and the second laser medium are each a rare earth metal.

31. The method for manufacturing a semiconductor device according to claim 3, wherein the laser medium is a rare earth metal.

32. The method for manufacturing a semiconductor device according to claim 4, wherein the first laser medium and the second laser medium are each a rare earth metal.

33. The method for manufacturing a semiconductor device according to claim 5, wherein the first laser medium and the second laser medium are each a rare earth metal.

34. The method for manufacturing a semiconductor device according to claim 6, wherein the first laser medium and the second laser medium are each a rare earth metal.

35. The method for manufacturing a semiconductor device according to claim 13, wherein the laser medium is a rare earth metal.

* * * * *